US008189328B2

(12) United States Patent
Kanapathippillai et al.

(10) Patent No.: US 8,189,328 B2
(45) Date of Patent: May 29, 2012

(54) METHODS AND APPARATUS OF DUAL INLINE MEMORY MODULES FOR FLASH MEMORY

(75) Inventors: Ruban Kanapathippillai, Pleasanton, CA (US); Kenneth Alan Okin, Los Altos, CA (US)

(73) Assignee: Virident Systems, Inc., Milpitas, CA (US)

( * ) Notice: Subject to any disclaimer, the term of this patent is extended or adjusted under 35 U.S.C. 154(b) by 0 days.

(21) Appl. No.: 11/876,479

(22) Filed: Oct. 22, 2007

(65) Prior Publication Data

US 2008/0094808 A1 Apr. 24, 2008

Related U.S. Application Data

(60) Provisional application No. 60/892,864, filed on Mar. 4, 2007, provisional application No. 60/862,597, filed on Oct. 23, 2006.

(51) Int. Cl.
H05K 7/00 (2006.01)
(52) U.S. Cl. ............ 361/679.32; 361/760; 361/679.31; 361/728; 361/748
(58) Field of Classification Search ............ 361/760, 361/683, 684, 686, 728, 729, 733, 736, 737, 361/748, 679.01, 679.31, 679.32, 679.4, 361/679.41
See application file for complete search history.

(56) References Cited

U.S. PATENT DOCUMENTS

| | | | |
|---|---|---|---|
| 4,757,533 A | 7/1988 | Allen et al. | |
| 5,012,408 A | 4/1991 | Conroy et al. | |
| 5,379,401 A | 1/1995 | Robinson et al. | |
| 5,404,485 A | 4/1995 | Ban | |
| 5,701,438 A | 12/1997 | Bains | |
| 5,710,733 A | 1/1998 | Chengson et al. | |
| 6,088,750 A | 7/2000 | Beaman et al. | |
| 6,185,704 B1 | 2/2001 | Pawate et al. | |
| 6,393,545 B1 | 5/2002 | Long et al. | |
| 6,549,959 B1 | 4/2003 | Yates et al. | |
| 6,564,326 B2 | 5/2003 | Helbig | |
| 6,765,812 B2 | 7/2004 | Anderson | |
| 6,785,780 B1 | 8/2004 | Klein et al. | |
| 6,970,968 B1 | 11/2005 | Holman | |
| 6,990,044 B2 | 1/2006 | Kang | |
| 7,034,955 B2 | 4/2006 | Bearss et al. | |
| 7,091,598 B2 * | 8/2006 | Fujita et al. | 257/691 |
| 7,196,554 B2 | 3/2007 | Taskin et al. | |
| 7,324,352 B2 | 1/2008 | Goodwin | |

(Continued)

OTHER PUBLICATIONS

Lee, H.G and Chang, N. "Energy-aware Memory Allocation in Heterogeneous Non-Volatile Memory Systems" Low Power Electronics and Design. Aug. 2003.

(Continued)

*Primary Examiner* — Hoa C Nguyen
(74) *Attorney, Agent, or Firm* — Alford Law Group, Inc.; William E. Alford

(57) ABSTRACT

In one embodiment of the invention, a flash memory dual inline memory module (FMDIMM) is disclosed. The FMDIMM includes a printed circuit board (PCB) with an edge connector; a first plurality of multi-chip packaged flash memory/support application specific integrated circuit (ASIC) parts mounted to the printed circuit board and electrically coupled to the edge connector; and a first address device mounted to the PCB and electrically coupled to the edge connector and the first plurality of multi-chip packaged flash memory/support ASIC parts. Each of the first plurality of multi-chip packaged flash memory/support ASIC parts includes one or more randomly accessible flash memory die to periodically store data in a non-volatile manner.

28 Claims, 20 Drawing Sheets

U.S. PATENT DOCUMENTS

| | | | | |
|---|---|---|---|---|
| 2002/0017720 | A1* | 2/2002 | Nishizawa et al. | 257/723 |
| 2002/0051350 | A1 | 5/2002 | Take | |
| 2002/0118593 | A1 | 8/2002 | Takemae | |
| 2002/0133684 | A1 | 9/2002 | Anderson | |
| 2002/0138600 | A1 | 9/2002 | Singhal | |
| 2003/0090879 | A1 | 5/2003 | Doblar | |
| 2003/0137862 | A1 | 7/2003 | Brunelle et al. | |
| 2003/0174569 | A1 | 9/2003 | Amidi | |
| 2003/0188083 | A1 | 10/2003 | Kumar et al. | |
| 2004/0026791 | A1* | 2/2004 | King et al. | 257/777 |
| 2004/0117581 | A1 | 6/2004 | Lee | |
| 2004/0160835 | A1 | 8/2004 | Altman et al. | |
| 2004/0186948 | A1 | 9/2004 | Lofgren et al. | |
| 2004/0193783 | A1 | 9/2004 | Sharma et al. | |
| 2004/0236877 | A1* | 11/2004 | Burton | 710/22 |
| 2005/0044303 | A1 | 2/2005 | Perego et al. | |
| 2005/0166026 | A1 | 7/2005 | Ware et al. | |
| 2005/0235131 | A1 | 10/2005 | Ware | |
| 2005/0240745 | A1 | 10/2005 | Iyer et al. | |
| 2005/0251617 | A1 | 11/2005 | Sinclair et al. | |
| 2005/0273570 | A1 | 12/2005 | DeSouter et al. | |
| 2005/0289317 | A1 | 12/2005 | Liou | |
| 2006/0050488 | A1* | 3/2006 | Goodwin | 361/749 |
| 2006/0106984 | A1 | 5/2006 | Bartley et al. | |
| 2006/0149857 | A1 | 7/2006 | Holman | |
| 2006/0195631 | A1 | 8/2006 | Rajamani | |
| 2006/0230250 | A1 | 10/2006 | Klint et al. | |
| 2007/0016704 | A1 | 1/2007 | Harari et al. | |
| 2007/0070669 | A1 | 3/2007 | Tsern | |
| 2007/0088995 | A1* | 4/2007 | Tsern et al. | 714/724 |
| 2007/0195613 | A1 | 8/2007 | Rajan et al. | |
| 2007/0276977 | A1* | 11/2007 | Coteus et al. | 710/305 |
| 2008/0001303 | A1* | 1/2008 | Yu et al. | 257/777 |
| 2008/0024899 | A1 | 1/2008 | Chu et al. | |
| 2008/0028186 | A1 | 1/2008 | Casselman | |
| 2008/0082731 | A1 | 4/2008 | Karamcheti et al. | |
| 2008/0082732 | A1 | 4/2008 | Karamcheti et al. | |
| 2008/0082733 | A1 | 4/2008 | Karamcheti et al. | |
| 2008/0082734 | A1 | 4/2008 | Karamcheti et al. | |
| 2008/0082750 | A1 | 4/2008 | Okin et al. | |
| 2008/0082751 | A1 | 4/2008 | Okin et al. | |
| 2008/0082766 | A1 | 4/2008 | Okin et al. | |
| 2008/0115006 | A1 | 5/2008 | Smith | |
| 2009/0210616 | A1 | 8/2009 | Karamcheti et al. | |
| 2009/0210636 | A1 | 8/2009 | Karamcheti et al. | |
| 2009/0254689 | A1 | 10/2009 | Karamcheti et al. | |

OTHER PUBLICATIONS

Tseng, H.W ; Li, H.L ; and Yang, C. L. "An energy-efficient Virtual Memory Systems with Flash Memory as the Secondary Storage" Low Power Electronics and Design 2006.

Martinez, David E., "Office Action in U.S. Appl. No. 11/847,986 Mailed May 12, 2009", Publisher: USPTO, Published in: US.

Martinez, David E., "Office Action in U.S. Appl. No. 11/848,013 Mailed Jun. 1, 2009", Publisher: USPTO, Published in: US.

Martinez, David E., "Office Action in U.S. Appl No. 11/848,040 Mailed May 26, 2009",, Publisher: USPTO, Published in: US.

Martinez, David E., "Office Action in U.S. Appl. No. 11/848,083 Mailed May 12, 2009", Publisher: USPTO, Published in: US.

Walter , Craig E., "Office Action in U.S. Appl. No. 11/864,763 Mailed Jun. 16, 2008", Publisher: USPTO, Published in: US.

Eland, Shawn, "Office Action in U.S. Appl. No. 11/864,763 Mailed Sep. 16, 2009", Publisher: USPTO, Published in: US.

Eland, Shawn, "Office Action in U.S. Appl. No. 11/864,763 Mailed Dec. 24, 2008", Publisher: USPTO, Published in: US.

Cheung, Raymond, "AQ1207:MPC824x Architecture and Applications", "Smart Networks Developer Forum 2003 Asia", Oct. 20, 2003, Publisher: Motorola, Published in: US.

Connor, Deni, "Kmart shines its Blue Light on solid state disks", May 7, 2001, Publisher: itworld.com, Published in: US.

Candea, George et al., "Microreboot A Technique for Cheap Recovery", 2004, Publisher: USENIX Association.

Thomas, Deborah A., "PCT/US07/080015 Written Opinion and Search Report Mailed Aug. 13, 2008".

Young, Lee W., "PCT/US09/33843 Written Opinion and Search Report Mailed Oct. 22, 2009".

Young, Lee W., "PCT/US07/79619 Written Opinion and Search Report Mailed Mar. 31, 2008".

Young, Lee W., "PCT/US07/079622 Written Opinion and Search Report Mailed Apr. 19, 2008".

Young, Lee W., "PCT/US07/82162 Written Opinion and Search Report Mailed Jun. 9, 2008".

Unknown Author, "3.5 in SATA SSD Drive", "www.SuperTalent.com", Aug. 17, 2007, pp. 1-3, Publisher: Super Talent Technology, Published in: US.

Williams, Martyn, "Solid-state disks coming on strong", "Infoworld.com", Jun. 7, 2007, Publisher: Macworld, The Mac Experts, Published in: US.

Micron Technical Note TN-04-02: Memory Module Serial Presence-Detect; Micron Technoloyg, Inc.; 2002; 13 pages.

Dipert, B. ; Levy, M. "Designing with Flash Memory" Annabooks. 1993. San Diego, CA. pp. 1-421.

Brown, W. ; Brewer,J. "Nonvolatile Semiconductor Memory Technology." IEEE Press, New York. 1998. pp. 189-194, 289-308.

Sharma, A. "Semiconductor Memories" IEEE Press, New York. 1997. pp. 81-139, 412-449.

Axelson, J. "USB Mass Storage" Independent Publishers Group, 2006. pp. 1-24.

Cappelletti, P. ; Golla, C. ; Olivo, P. ; Zanoni, E. "Flash Memories" Kluwer Academic Publishers. 1999. pp. 1-3, 241-257, 446-447, 481-526.

BA Chappell et al. "Main Memory Database Computer Architecture." Aug. 1991. IBM TDB. No. 3. pp. 6-12.

Galen A. Grimes. "Sams Teach Yourself Upgrading and Fixing PCs in 24 Hours". Aug. 1998. Sams Publishing, 1st Ed. pp. 53-65.

Arie Tal, NAND Vs. NOR Flash Technology, Feb. 1, 2002, Whole Document, http://www2.electronicproducts.com/NAND vs NOR flash_technology-article-FEBMSYI-feb2002-html.aspx, 5 pages.

Gary Million, Aug. 2000, PowerPC—MPC107 Design Guide, section 1.5, http://cache.freescale.com/files/32bitldoc/app_note/AN1849.pdf, 36 pages.

* cited by examiner

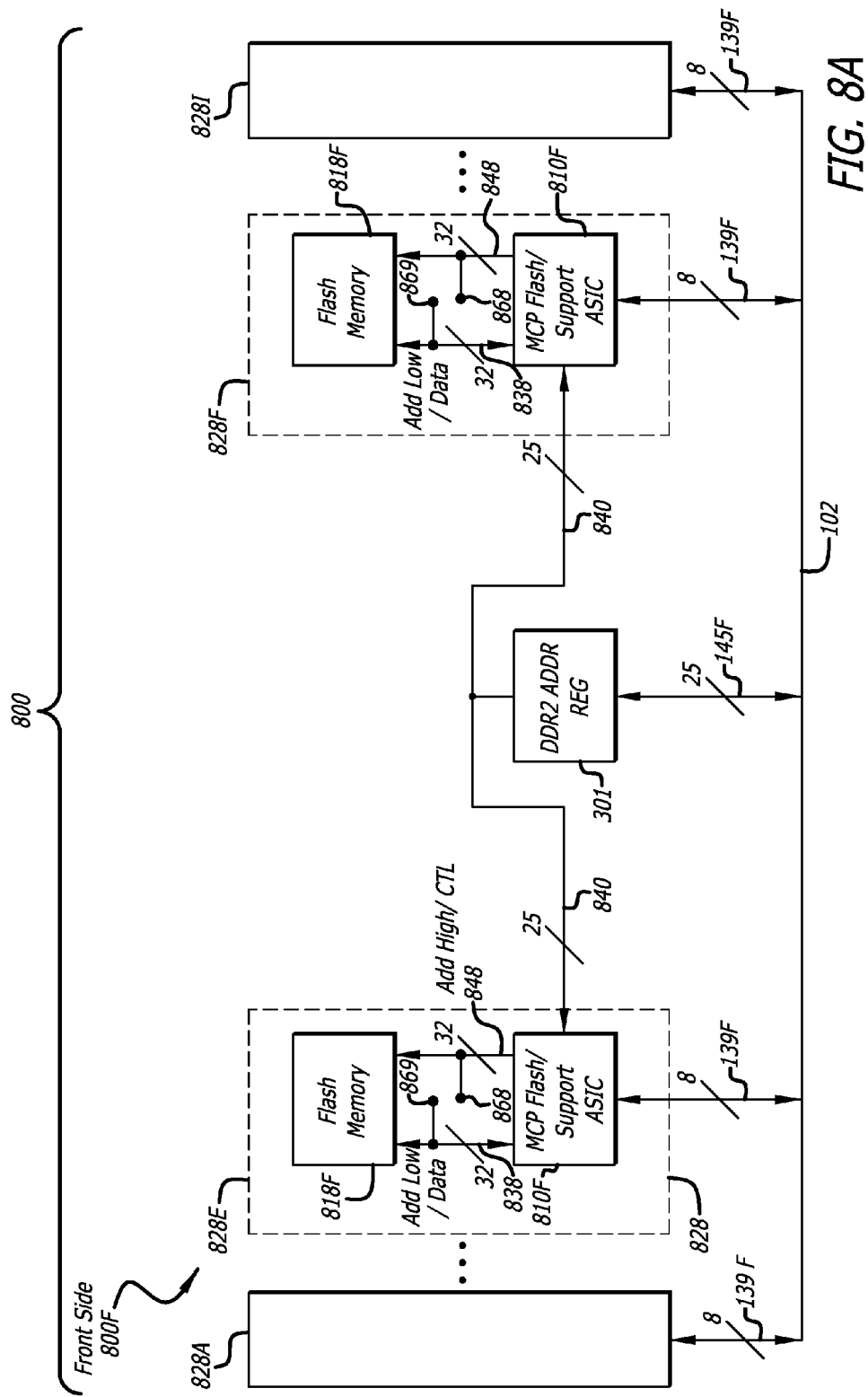

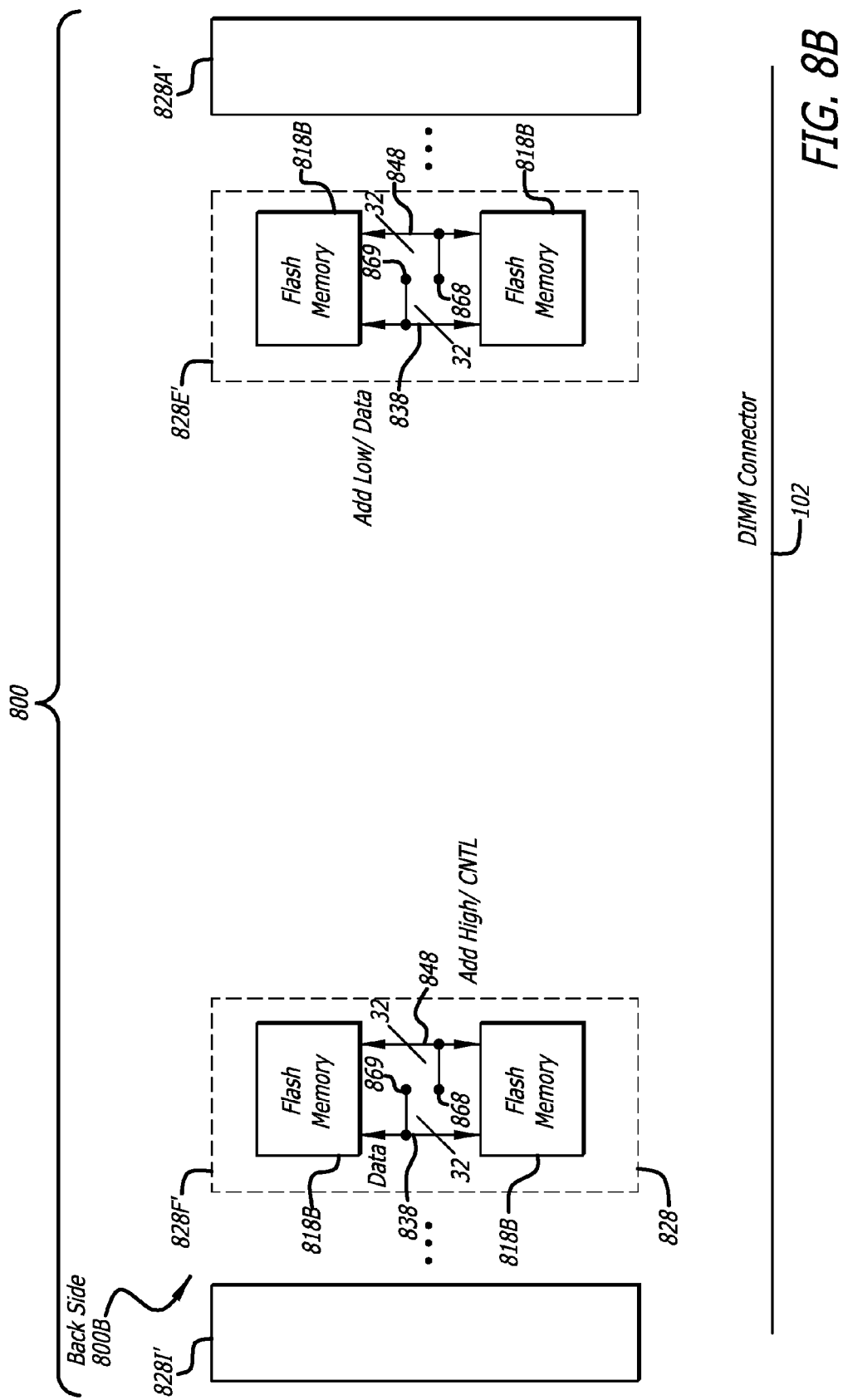

METHODS AND APPARATUS OF DUAL INLINE MEMORY MODULES FOR FLASH MEMORY

CROSS-REFERENCE TO RELATED APPLICATIONS

This patent application claims the benefit of U.S. provisional patent application No. 60/892,864 filed on Mar. 4, 2007 by inventors Ruban Kanapathippillai, et al., entitled DUAL INLINE MEMORY MODULES FOR FLASH MEMORY and further claims the benefit of U.S. provisional patent application No. 60/862,597 filed on Oct. 23, 2006 by inventors Kumar Ganapathy, et al., entitled EXPANSION OF MAIN MEMORY IN A MULTIPROCESSOR SYSTEM WITH A NON-DRAM MEMORY CONTROLLER TO CONTROL ACCESS TO NON-DRAM TYPE MEMORY.

FIELD

This application relates generally to memory modules for non-volatile memory integrated circuits.

BACKGROUND

Pluggable memory modules are often used to add more dynamic random access memory (DRAM) to a pre-existing computer system. However, sometimes there are space limitations in a system that place height limits upon a memory module. Designing a pluggable memory module to have appropriate electrical characteristics and an appropriate form factor can be challenging.

BRIEF DESCRIPTIONS OF THE DRAWINGS

FIG. 8A is a functional block diagram of a front side of a flash memory DIMM with flash memory parts and multi-chip packaged flash memory/support ASIC parts.

FIG. 8B is a functional block diagram of a back side of the flash DIMM of FIG. 8A.

DETAILED DESCRIPTION

In the following detailed description, numerous examples of specific implementations are set forth. However, implementations may include configurations that include less than all or alternatives for the detailed features and combinations set forth in these examples.

The voltage of the power supply to flash memory integrated circuits may differ from the voltage of the power supply to a motherboard of a computer system. Flash memory integrated circuits may operate and program its internal memory cells using one external power supply voltage (voltage F), such as three and three-tenths (3.3) volt power supply. However, computer systems may furnish a differing external power supply voltage (voltage E), such as a one and eighth-tenths (1.8) volt power supply. Some designs of flash memory integrated circuits may be incapable of directly operating with the external power supply voltage (voltage E) furnished by the computer system. The differing external power supply voltage (voltage E) may be externally converted to the power supply voltage (voltage F) expected by the flash memory integrated circuits to operate and program its internal memory cells. For example, in those cases where flash memory integrated circuits are incapable of directly operating with the external power supply voltage (voltage E), other circuits in a dual inline memory module (DIMM) can perform DC power conversion to convert the differing external power supply voltage (voltage E) at an edge connector into the power supply voltage (voltage F) expected by the flash memory integrated circuits.

In the design of a non-volatile flash DIMM, the form factor, including any height limitations, may be considered in the layout design of the non-volatile DIMM.

Figure 1A:
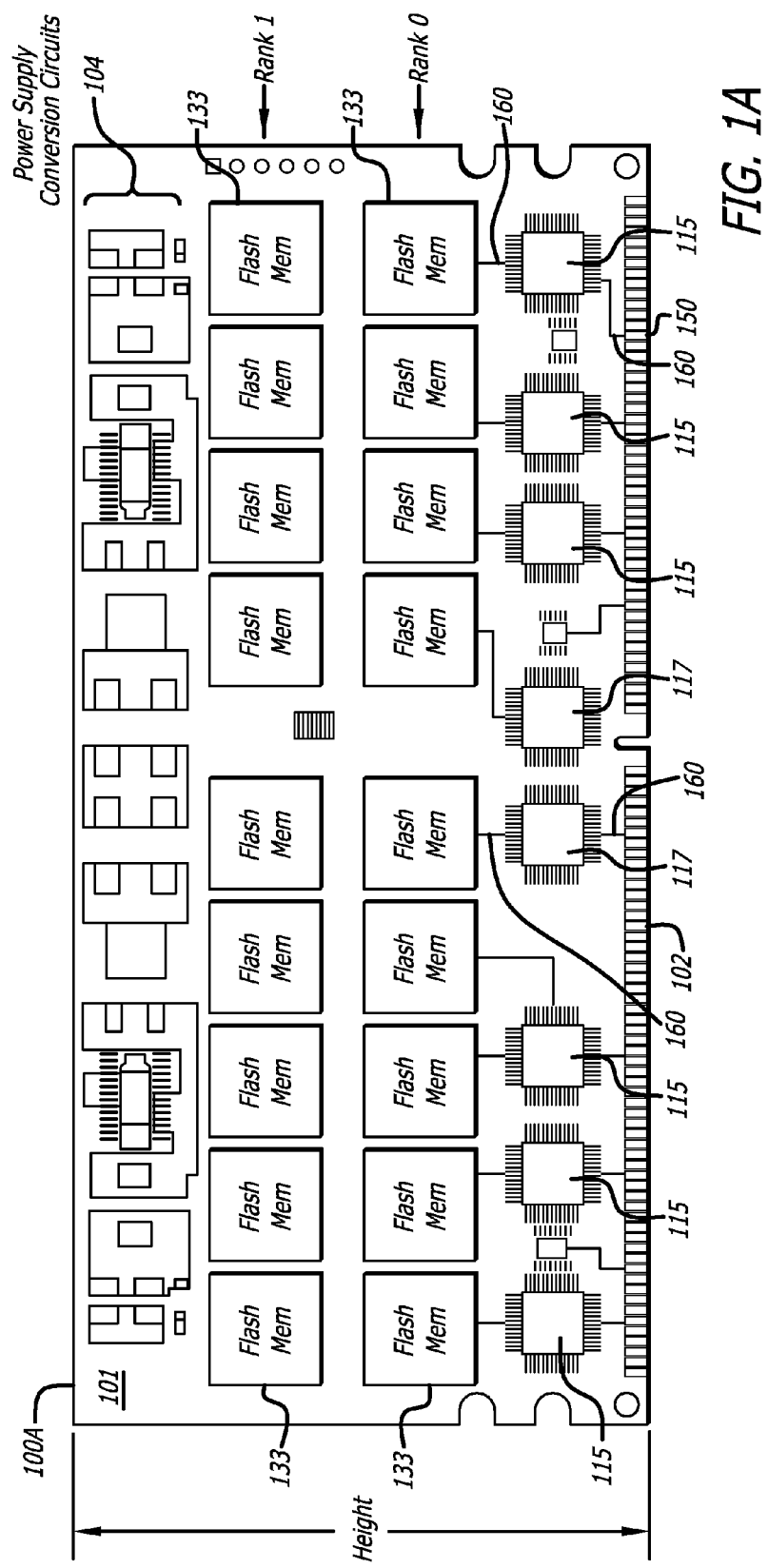
FIG. 1A is a layout of a flash DIMM with flash memory integrated circuits capable of operating with a different power supply voltage from that furnished at the edge connector.

Referring now to FIG. 1A, a layout design of a flash dual inline memory module (DIMM) 100A with flash memory 133 is illustrated. The flash memory 133 in this case operates with a different voltage (voltage F) than the external power supply voltage (voltage E) furnished at the edge connector 102. The flash DIMM 100A includes on one or both sides of the printed circuit board 101, a DIMM edge connector 102, power supply conversion and regulation circuitry 104, a plurality of memory support circuits (e.g., data support application specific integrated circuits (ASICs) 115 for data support and commercially available address support chips or proprietary address support application specific integrated circuits 117), and flash memory chips 133 coupled together by a plurality of printed circuit board traces, such as trace 160 for example between a pad 150 of the edge connector 102 and a pin of the data ASIC 115.

Near an edge the printed circuit board 101 has pads on a front side, a back side, or both front and back sides to form the edge connector 102. The memory module 100A further includes a plurality of printed circuit board traces 160 (e.g., printed wires) formed on and/or in one or more layers of the PCB 101 to electrically couple the packaged parts together to each other and/or to the pads 150 of the edge connector 102. The packaged parts, devices, and circuits are mounted to the printed circuit board (PCB) they are mounted on a surface (e.g., a surface layer of printed circuit board traces) of the PCB on a front side, a back side, or both front and back sides as well as electrically coupled to the printed circuit board traces. In one configuration, a DIMM connector 102 may have 240 pins or pads of which 72 bits may be used for data, 28 to 40 pins may be used for address/control, and the remaining pins or pads may be used for power and ground.

The plurality of memory support chips, (e.g., the address support chips 117 and the data support ASICs 115) may be used to buffer and/or register addresses, and/or multiplex and de-multiplex data to and from the flash memory chips 133.

The flash memory dual inline memory module (FM-DIMM) 100A is a non-volatile type of memory module. In particular, the non-volatile type of memory module may include at least one NOR-gate flash electrically erasable programmable read only memory (EEPROM) integrated circuit. NAND-gate flash electrically erasable programmable read only memory (EEPROM) integrated circuits may also be used in a flash memory DIMM. Phase shift dynamic random access memory (PSDRAM) may also be used in a flash memory DIMM. Additionally, memory types may be mixed in a flash memory DIMM. For example, non-volatile memory such as EEPROM flash memory may be mixed with volatile memory such as standard DRAM memory to form a flash memory DIMM. Non-volatile memory of any type may also be generally referred to herein as flash memory.

Flash memory may operate using one power supply voltage (voltage F). Computer systems may operate at different power supply voltage (voltage E) such that the signals and power supply expected and provided at the DIMM edge connector when plugged in are in accordance with DIMM edge connector power and signal standards. The power supply conversion and regulation circuitry 104 converts the external power supply voltage (voltage E) from the edge of the DIMM connector 102 into the operating power supply voltage (voltage F) for the flash memory 133. The power supply voltages levels to be provided at the edge connector may be in accordance with Joint Electron Device Engineering Council's (JEDEC) double data rate (DDR) memory standards (2.5 volts), JEDEC DDR2 memory standards (1.8 volts), or JEDEC DDR3 memory standards for dual inline memory modules (1.5 volts). The Joint Electron Device Engineering Council is the semiconductor engineering standardization body of the Electronic Industries Alliance (EIA), a trade association representing many areas of the electronics industry. For example, in accordance with a DDR2 memory module standard, at the interface of the connector 102, a power supply voltage of 1.8 volts may be provided and the circuitry 104 converts the 1.8 volts into a 3.3 volt power supply expected by some generations of flash memory 133. As another example, in accordance with a DDR3 memory module standard, a power supply voltage of 1.5 volts may be provided at the edge connector and the circuitry 104 converts the 1.5 volt power supply into a 1.8 volt power supply expected by another generation of flash memory 133.

Both of the power supplies with the different power supply voltages may be coupled into the address and data support ASICs 117,115 so that they can translate signals between each signaling standard. For example, at the interface of the connector 102, 1.8 volt standard signals may be expected while some generations of flash memory 133 may be expecting 3.3 volt standard signals at the chip interface. In this case, the address and data support ASICs 117,115 may receive 1.8 volt standard signals for address/control and data from the edge connector and convert them into 3.3 volt standard signals for the flash memory. Additionally, the address and data support ASICs 117,115 may receive 3.3 volt standard signals for data from the flash memory and convert them into 1.8 volt standard signals for driving data out onto the edge connector. Thus, the address and data support ASICs 117,115 may perform voltage translation for signals between the edge connector and the flash memory.

The power supply conversion and regulation circuitry 104 uses space on the printed circuit board (PCB) 101 as shown in FIG. 1A. Additionally, the address and data support ASICs and chips 117,115 take up space on the PCB 101 in a row along the connector 102 adding further to the height of the DIMM 100 as illustrated in FIG. 1A.

The height added to the DIMM 100A by power supply conversion and regulation circuitry 104 and the address and data support ASICs and chips 117,115 may be so much that it exceeds one unit (1 U) standard height of thirty millimeters (mm). As a result of the larger height, the flash DIMM 100A may not be usable in a number of computing systems that use one unit standard height DIMMs.

The flash memory 133 can be redesigned so that it can operate using the external voltage supplied at the DIMM edge connector instead so that the power supply conversion and regulation circuitry 104 may be eliminated from the DIMM 100A. Moreover, the packaged flash memory 133 may only contain a single die. The flash memory coupled to the DIMM may be re-packaged to include a plurality of flash memory die in one package to increase memory capacity and/or reduce the number of packaged parts mounted to the PCB of the DIMM. With fewer parts mounted to the PCB of the DIMM, the height of the DIMM may be reduced.

Moreover, the address and/or data support chips 117,115 may be further packaged together with flash memory to reduce the height of a DIMM (e.g., a 16 giga-byte DIMM) down to thirty millimeter for one unit standard height systems. Various configurations of flash memory chips and address and data support ASICs may also be used to reduce the number of PCB traces and further reduce the height of the PCB and DIMM. In this manner, a flash DIMM may be more widely sold and used to achieve economies of scale.

Figure 1B:
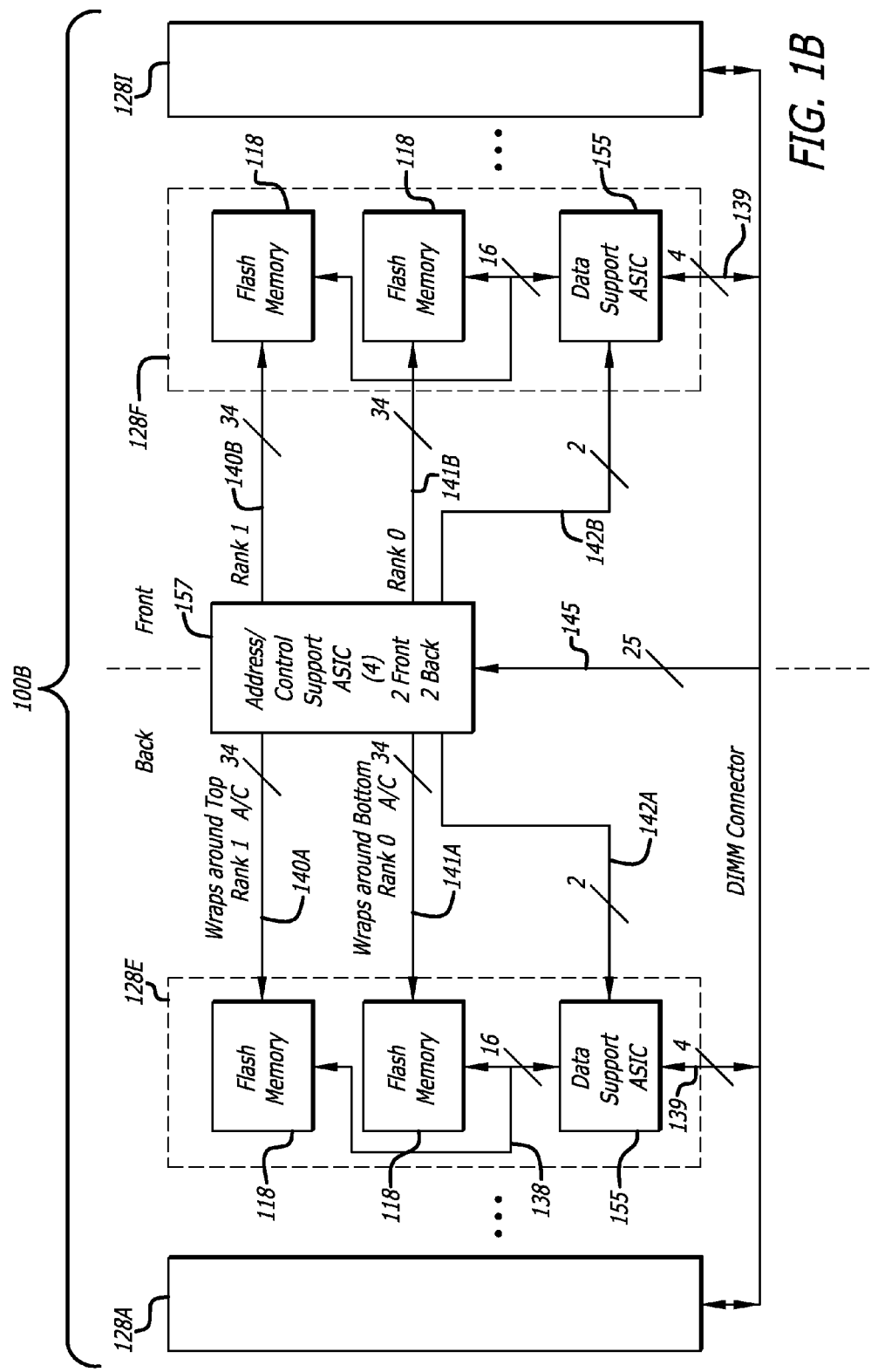
FIG. 1B is a functional block diagram of a flash DIMM with flash memory integrated circuits capable of operating with a substantially similar power supply voltage to that furnished at the edge connector.

Referring now to FIG. 1B, a block diagram of a flash memory DIMM (FMDIMM) 100B is illustrated. Several address/control buffer ASICs may be integrated into a multi-chip package or multi-chip module (MCM) to form a multi-chip packaged address/control ASIC part 157 to reduce the height of the PCB. A plurality of flash memory dice or die (e.g., four) may be mounted together into one multi-chip package or multi-chip module (MCM) to form a multi-chip packaged flash memory part 118 to reduce the height of the PCB. In other implementations, a support ASIC die and one or more flash memory dice may be mounted together into one multi-chip package or multi-chip module (MCM) to form a multi-chip packaged flash memory/support ASIC part to further reduce the number of packaged parts mounted to the PCB of a FMDIMM.

Previously, an integrated circuit package with multiple chips mounted therein may have been referred to as a hybrid package or a multi-chip module. More recently, hybrid packages and multi-chip modules are referred to as multi-chip packages (MCP) or chip-scale packages (CSP), ignoring whether or not the chips are stacked upon each other or not.

The data support ASIC part 155 multiplexes and de-multiplexes the data lines of the plurality of flash memory die with an external data bus. In one implementation, a four to one bus multiplexer and a one to four bus demultiplexer is provided by the data support ASIC part 155.

The flash memory DIMM 100B includes a plurality of flash memory chips 118 with other memory support application integrated circuit (ASIC) chips that operate with a power supply that matches the expected signal levels and power supply of the computer system into which the FMDIMM 100B may be plugged. In one implementation, the chips use a one and eight-tenths (1.8) volt power supply. By operating with a power supply that matches the expected signal levels and power supply of the computer system into which the FMDIMM 100B may be plugged, the power supply conversion and regulation circuitry 104 can be eliminated to reduce the height of the PCB and DIMM.

The FMDIMM 100B is configured with two ranks (rank zero and rank one) of flash memory each having eighteen flash memory chips 118 with address lines 140A,140B,141A, 141B coupled into each flash memory chip 118 to address memory space. Rank zero and rank one may each have nine flash memory chips 118 mounted onto the front of the PCB and nine flash memory chips 118 mounted onto the back side of the PCB for a total of thirty-six flash memory packages 118 being included as part of the FMDIMM 100B. As discussed further herein, a plurality of flash memory integrated circuits may be packaged into one multi-chip package such as an MCM integrated circuit package to further reduce the number of packages mounted to the printed circuit board (PCB) of the FMDIMM.

The flash memory DIMM 100B further includes address/control support ASIC parts 157 and data support ASIC parts 155 coupled together and to the flash memory parts 118 as illustrated. The data support ASIC parts 155 may be mounted to the printed circuit board in a row next to the edge connector 102. The address/control support ASIC parts 157 may be mounted to the printed circuit board between a left plurality of flash memory parts 118 in each row and a right plurality of flash memory parts 118 in each row. There may be five memory slices 128A-128E to one side of the address/control support parts 157 and four memory slices 128F-128I to the other side of the address support parts 157.

The flash memory DIMM 100B may have four address/control support ASIC parts 157, two of which may be mounted on the front side and two of which may be mounted on the back side of the PCB. Two address/control support ASICs 157, each on opposite sides of the PCB, may be provided for each rank or row of flash memory. Each of the address/control support ASICs 157 may receive address lines 145 that are used to register or latch address/control information over two clock cycles. Typically, the lower address bits are sent in the first clock cycle and the upper address bits/control bits are sent in the second clock cycle. A rank control signal may be used to designate which rank of memory the address information is for. The address/control information may be decoded to generate address lines 140A-140B for rank zero, address lines 141A-141B for rank one, and multiplexer control signals 142A-142B coupled to the data support ASIC parts 155. The address lines 141A-141B, 140A-140B for memory ranks zero and one may be routed between front and back sides of the PCB such as by means of through-holes, vias, or wrapping around an edge (e.g. bottom or top edge) of the PCB. Half of the address lines may be generated by address support/control ASICs 157 on a front side of the PCB and the other half of address lines may be generated by address/control support ASICs 157 on the back side of the PCB. The address/control support ASICs 157 may buffer and broadcast the addresses to the flash memory parts 118 to reduce loading of the address lines at the edge connector.

Each side may have nine memory slices or columns 128A-128I with each memory slice 128 including a flash memory chip 118 in rank one, a flash memory chip 118 in rank zero, and a data support ASIC 155 coupled together as shown in FIG. 1B.

Each of the data support ASICs 155 may include a four to one multiplexer and one into four demultiplexer so that bidirectional data can be communicated between a sixteen bit data bus 138 in each slice and a four bit data bus 139 into the connector 102. That is, sixteen bits of data in bus 138 may be multiplexed out to four bits of the data bus 139 over four consecutive cycles when reading out data from the FMDIMM 100B. When writing data into the FMDIMM 100B, four bits of data on the data bus 139 from each of four consecutive data cycles may be de-multiplexed into four of the sixteen bits of the data bus 138.

Figure 2A:
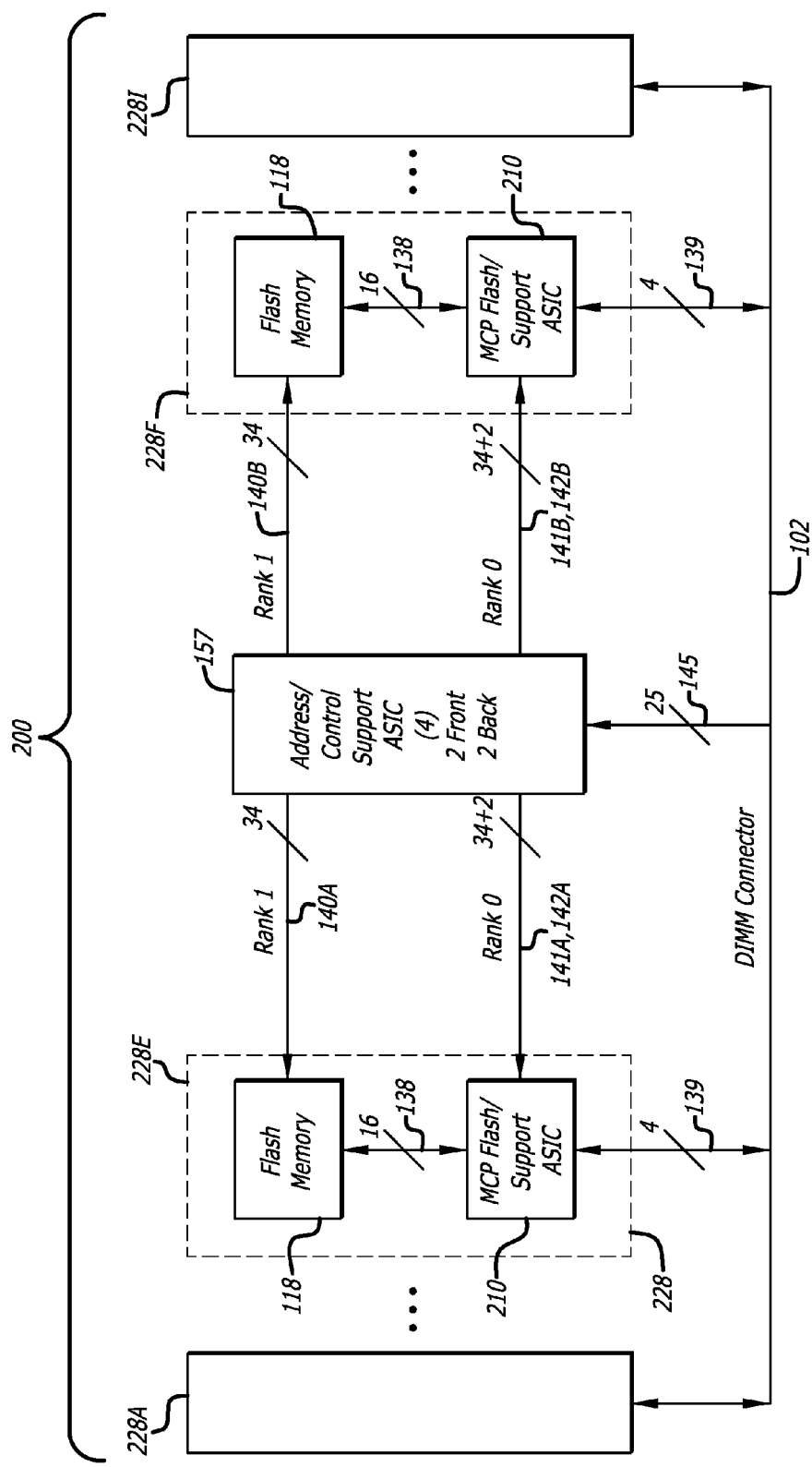
FIG. 2A is a functional block diagram of a flash DIMM with flash memory parts and multi-chip packaged flash memory/data support ASIC parts.

FIG. 2A is a functional block diagram of another configuration of a flash memory dual inline memory module (FMDIMM) 200. The flash memory dual inline memory module (FMDIMM) 200 includes a plurality of multi-chip packaged flash memory parts 118, a plurality of multi-chip packaged flash memory/data support ASIC parts 210, and a plurality of plurality of address support ASICs 157 coupled together as shown.

The data support ASIC die is of a relatively small die size so that it can be integrated with a flash memory chip into a multi-chip package 210. The multi-chip packaged flash memory/data support ASIC part 210 including flash memory may be used in one rank of memory, rank zero for example. This removes a number of the data support ASIC packages from the printed circuit board so that its height may be reduced. However a plurality of address support ASICs 157 may still be employed in the FMDIMM 200 so that the address pins/pads of the connector 102 are routed to both ranks (rank one and rank zero) independently, such that extra printed circuit board layers may be used to route the traces over other address lines.

The FMDIMM 200 includes a plurality of memory slices 228A-228I (generally referred to as memory slice 228) on each side. Each memory slice 228 includes one packaged flash memory chip 118 and one multi-chip packaged flash memory/data support ASIC packaged part 210. The data on bus 139 may be routed through the multi-chip packaged flash memory/data support ASIC part 210 to and from the flash memory chip 118 over the bus 138.

Figure 2B:
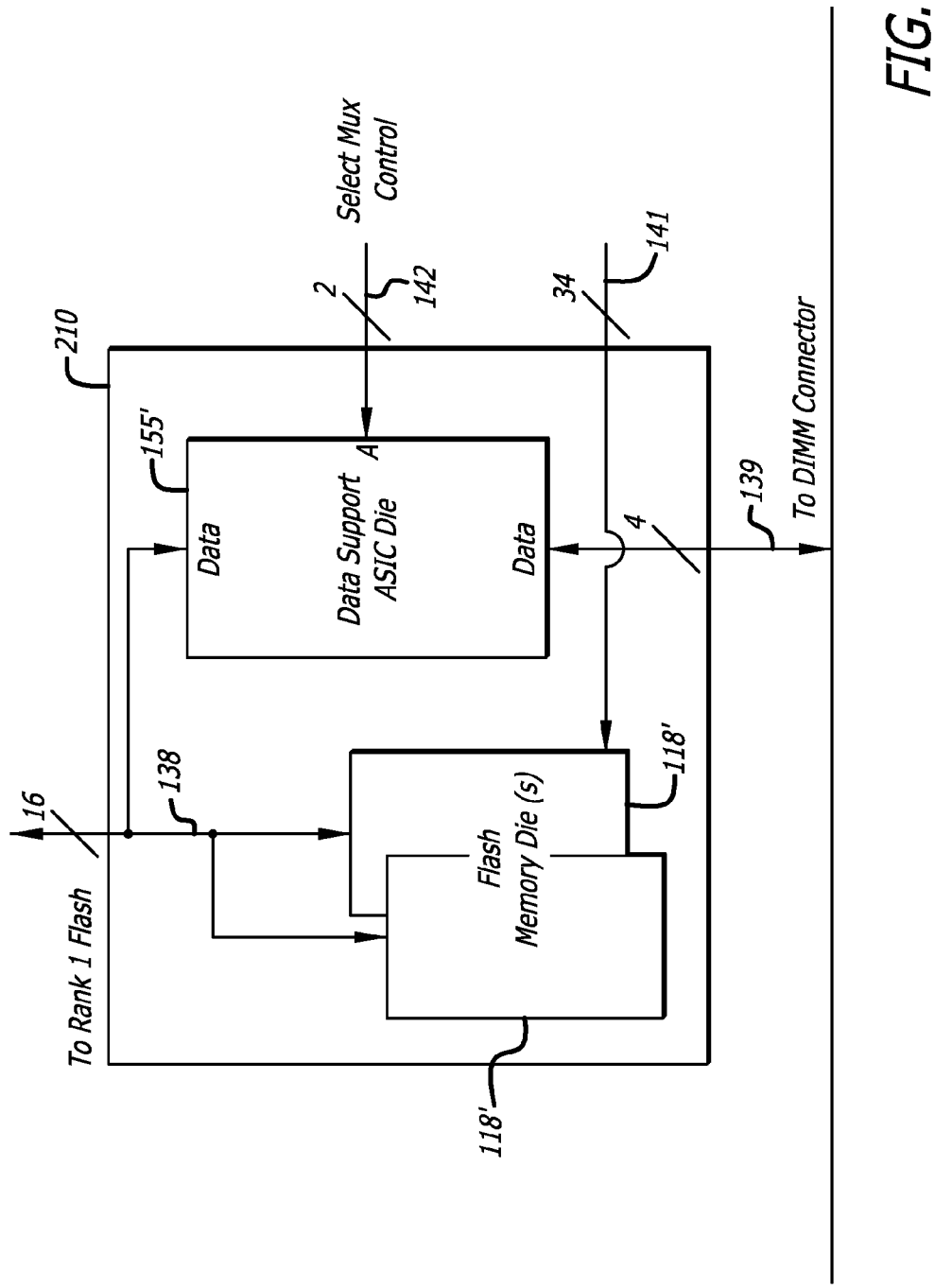
FIG. 2B is a functional block diagram of the multi-chip packaged flash memory/data support ASIC part of FIG. 2A.

FIG. 2B is a functional block diagram of the multi-chip packaged flash memory/data support ASIC part 210 of FIG. 2A. The multi-chip packaged flash memory/data support ASIC part 210 includes one or more unpackaged flash memory dice 118' and an unpackaged data support ASIC die 155' coupled together as shown. The unpackaged flash memory and the unpackaged data support ASIC dice are mounted to a substrate of the multi-chip packaged with traces of the bus 138 routed between each. The four bit bus 139 is coupled into the data support ASIC chip 155'. With eighteen multi-chip packaged flash memory/data support ASIC parts 210 in a rank, eighteen data support ASIC dice 155' are used per FMDIMM 200.

Figure 3A:
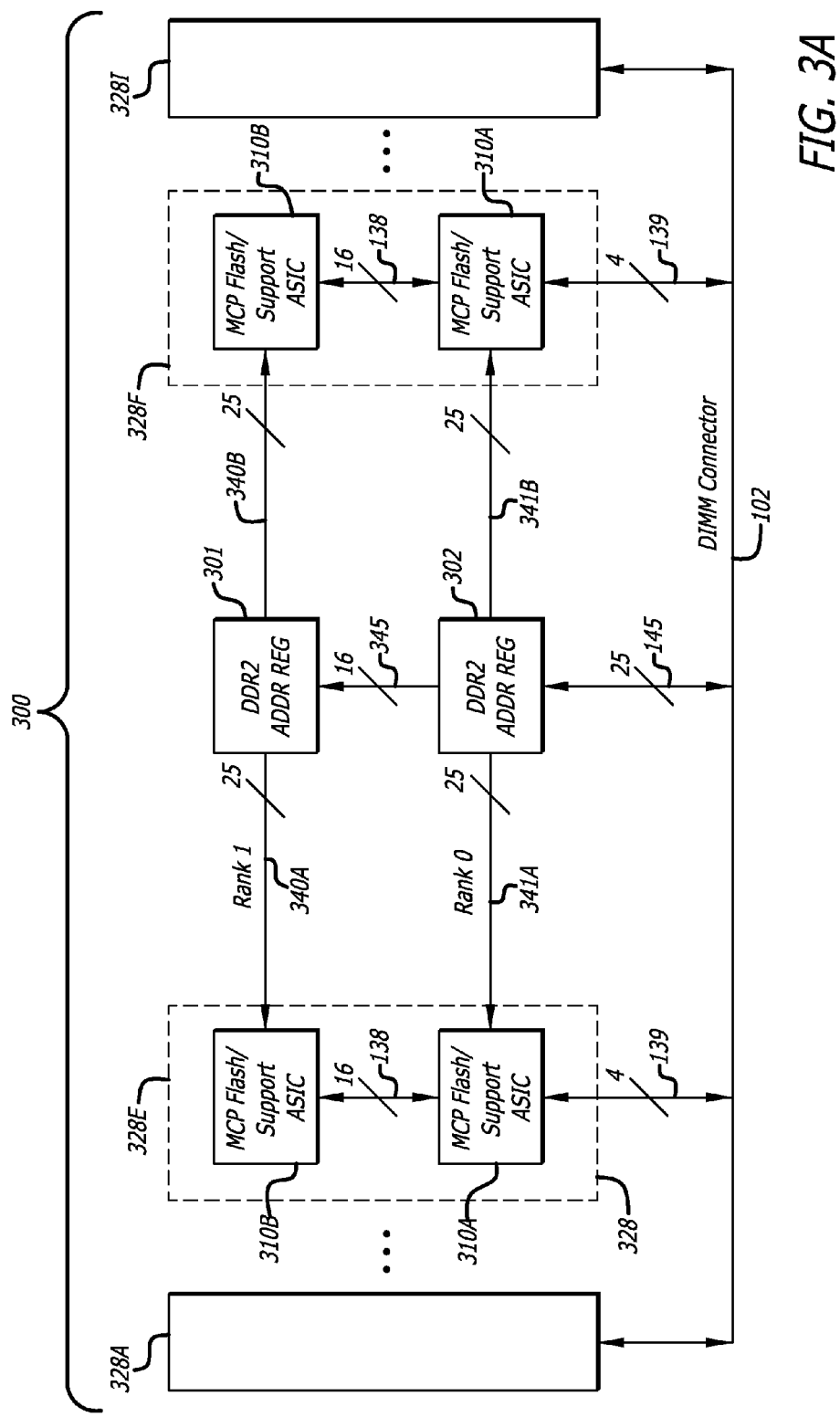
FIG. 3A is a functional block diagram of a flash DIMM with multi-chip packaged flash memory/support ASIC parts and standard address registers.

Referring now to FIG. 3A, a functional block diagram of another implementation of a flash memory DIMM (FM- DIMM) 300 is illustrated. The flash memory DIMM 300 includes a plurality of multi-chip packaged flash memory/support ASIC parts 310A-310B (collectively referred to by the reference number 310) and standard DDR2 address registers 301-302 coupled together. A portion of the address/control support ASIC 157 is combined with the data support ASIC 155 into one die and mounted with flash memory dice into a multi-chip package (MCP) to form the multi-chip packaged flash memory/support ASIC part 310. This eliminates the cost of having two different ASIC parts by using one ASIC and a standard off the shelf address register chip. Moreover, the number of address lines may be reduced and the number of PCB board layers may be reduced to lower cost of manufacturing the FMDIMM. As the multi-chip packaged flash memory/support ASIC part 310 provides data, address, and control support, it may also be referred to as a multi-chip packaged flash memory/address, control, & data support ASIC part 310.

The FMDIMM 300 includes a plurality of memory slices 328A-328I on each side. Each memory slice 328 includes a pair of multi-chip packaged flash memory/support ASIC parts 310A-310B. The data on bus 139 may be routed through the multi-chip packaged flash memory/support ASIC part 310A to and from the multi-chip packaged flash memory/support ASIC part 310B over the bus 138. The multi-chip packaged flash memory/support ASIC part 310B may be substantially similar to the multi-chip packaged flash memory/support ASIC part 310A. However, the multi-chip packaged flash memory/support ASIC packaged part 310B is not directly coupled to the connector 102 of the DIMM 300 so it may be simplified and with data being passed to it, it may operate somewhat differently.

The multi-chip packaged flash memory/support ASIC packaged part 310A passes data from the edge connector 102 through it to the multi-chip packaged flash memory/support ASIC packaged part 310B over the bus 138. Similarly, the multi-chip packaged flash memory/support ASIC packaged part 310A may receive data from the multi-chip packaged flash memory/support ASIC packaged part 310B on the bus 138 and pass it through it to the edge connector 102.

The address lines 145 from the edge connector 102 are coupled into the address register 302. The address may be passed from the address register 302 to the address register 301 over the address bus 345. Each of the address registers drives address lines out each side. The address register 301 drives address lines 340A to the slices 328A-328E and address lines 340B to the slices 328F-328I. The address register 302 drives address lines 341A to the slices 328A-328E and address lines 341B to the slices 328F-328I. The number of address lines is reduced because the addresses are buffered and fully formed in the support ASIC residing in the packages 310A-310B reducing the routing traces and the space used on the PCB. Moreover with fewer address lines, the multi-chip integrated circuit packages have fewer pins which may reduce packaging costs. Also, the address bus width is cut in half by sending the complete address over 2 cycles reducing the number of address traces on the PCB, the number of PCB board layers may be reduced as a result.

Figure 3B:
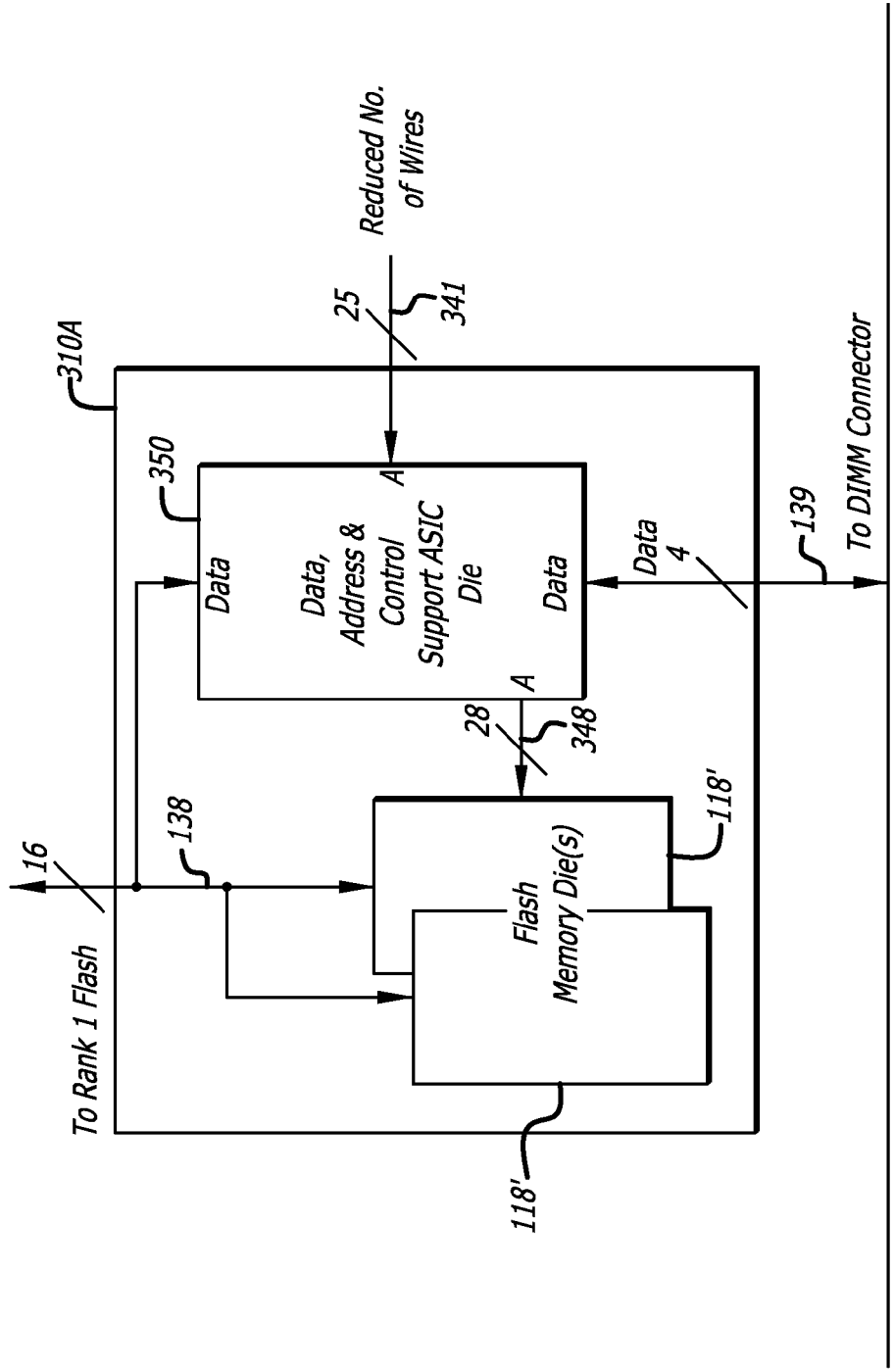
FIG. 3B is a functional block diagram of the multi-chip packaged flash memory/support ASIC part of FIG. 3A.

FIG. 3B is a functional block diagram of the multi-chip packaged flash memory/support ASIC part 310A of FIG. 3A. The multi-chip packaged flash memory/support ASIC part 310A includes one or more unpackaged flash memory dice 118' and an unpackaged address/control/data support ASIC die 350 coupled together as shown. The chips are mounted to a substrate of the multi-chip package with traces of the data bus 138 and the flash address bus 348 routed between each as illustrated. The bit data bus bits 139 and the input address bus 341 are coupled to the address/control/data support ASIC chip 350. As previously mentioned, a portion of the function of the address/control support ASIC 157 may be integrated with the function of the data support ASIC 155 into one chip, the address/control/data support ASIC chip 350. However with extra functionality, the address/control/data support ASIC chip 350 requires the use of more input/output pins.

Additionally, with the pass through of data, addresses, and control signals from the multi-chip packaged flash memory/support ASIC part 310A to the multi-chip packaged flash memory/support ASIC part 310B, the data latency into and out of the FMDIMM may be increased by one clock cycle.

Figure 4A:
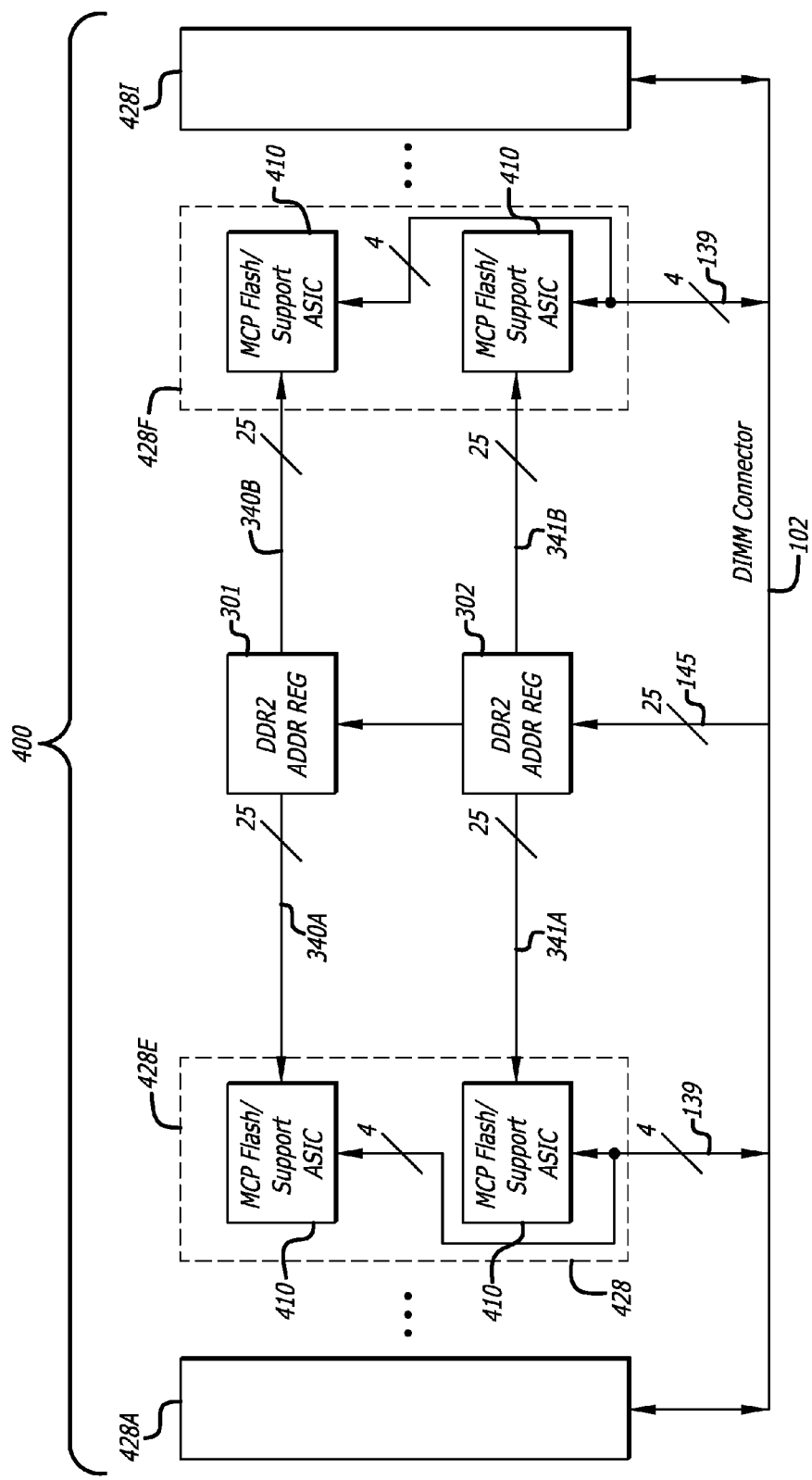
FIG. 4A is a functional block diagram of a flash DIMM with flash memory parts and multi-chip packaged flash memory/support ASIC parts.

Referring now to FIG. 4A, a functional block diagram is illustrated of another configuration of a flash memory DIMM 400. The flash memory DIMM 400 includes a plurality of multi-chip packaged flash memory/support ASIC parts 410 and address registers 301-302 coupled together. As the multi-chip packaged flash memory/support ASIC part 410 provides data, address, and control support, it may also be referred to as a multi-chip packaged flash memory/address, control, & data support ASIC part 410.

The FMDIMM 400 includes a plurality of memory slices 428A-428I on each side. In one implementation, nine memory slices 428A-428I on each side are divided by the address registers 301-302 into five and four memory slices into a row. Each memory slice 428 includes a pair of multi-chip packaged flash memory/support ASIC packaged parts 410. The data bus 139 is coupled to each of the multi-chip packaged flash memory/support ASIC packaged parts 410 so that a pass through bus 138 is not needed, thereby reducing the number of routing traces on the printed circuit board. Thus, the FMDIMM 400 has a data bus shared between memory ranks zero and one. With the number of lines of an address bus cut in half and the number of lines of a data bus significantly reduced, the number of layers in the PCB may be reduced as well.

The address register 301 drives 20 address lines 340A to the slices 428A-428E and 20 address lines 340B to the slices 428A-428I coupling to the upper row multi-chip packaged flash memory/support ASIC packaged parts 410 in each. The address register 302 drives 20 address lines 341A to the slices 428A-428E and 20 address lines 341B to the slices 428F-428I coupling to the lower row multi-chip packaged flash memory/support ASIC packaged parts 410 in each.

Figure 4B:
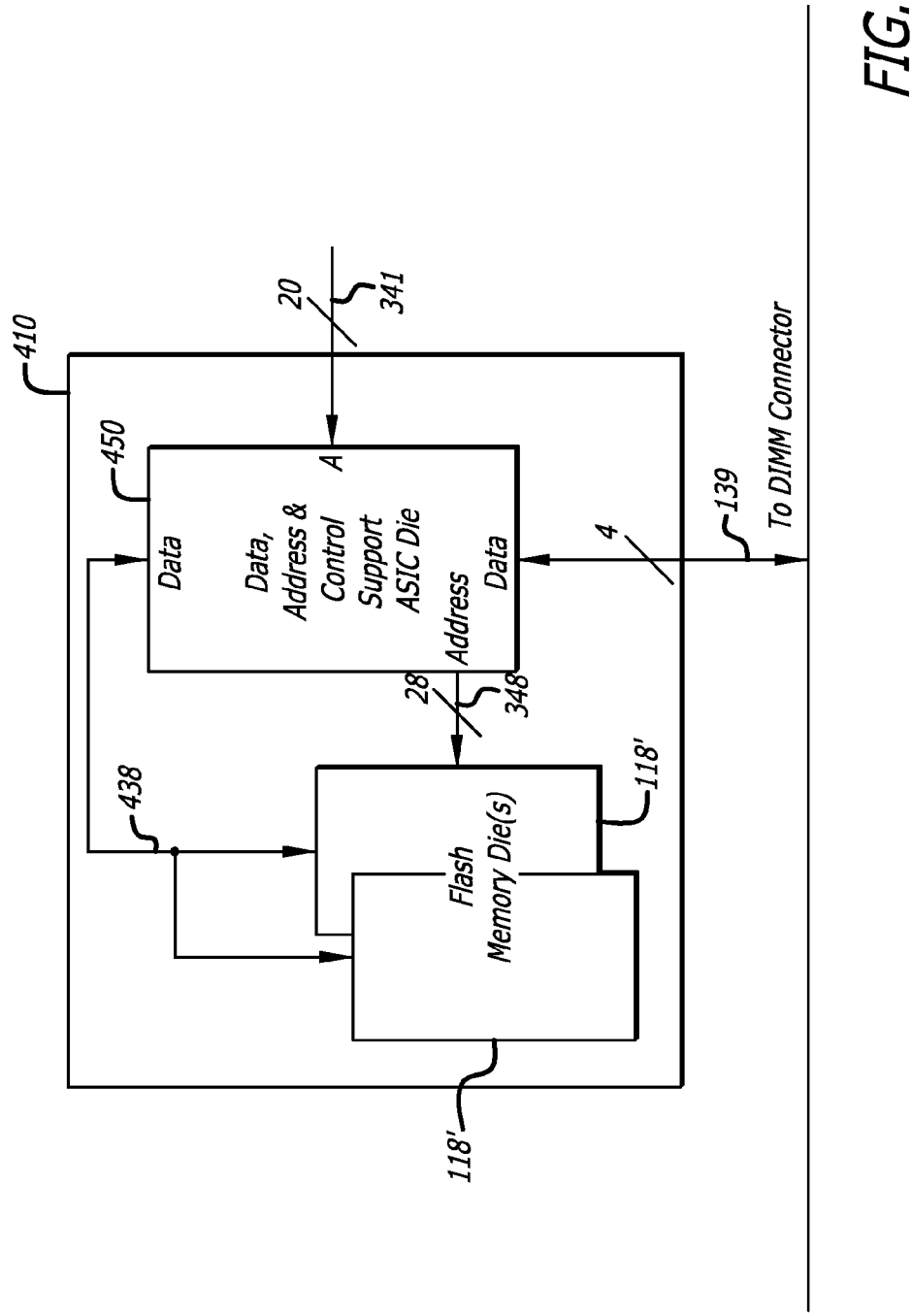
FIG. 4B is a functional block diagram of the multi-chip packaged flash memory/support ASIC part of FIG. 4A.

FIG. 4B is a functional block diagram of the multi-chip flash memory/support ASIC packaged part 410 of FIG. 4A. The multi-chip packaged flash memory/support ASIC part 410 includes one or more unpackaged flash memory dice 118' and an unpackaged address/control/data support ASIC die 450 coupled together as shown. The dice are mounted to a substrate of the multi-chip packaged package with traces of the data bus 438 and an address bus 348 routed between each as illustrated. The four bit data bus 139 and the address bus 341 are coupled to the address/control/data support ASIC die 450. As previously mentioned, a portion of the function of the address/control support ASIC 157 may be integrated with the function of the data support ASIC 155 into one die, the address/control/data support ASIC die 450. The extra functionality, the address/control/data support ASIC die 450 may use additional input/output pins. Moreover, the address/control/data support ASIC die 450 is functionally more complex with more gates and thus has a larger die size and may cost more to manufacture. If the address/control/data support ASIC die 450 is implemented as a programmable logic device, it is a complex programmable logic device (CPLD).

For thirty-six multi-chip packaged parts 410 in each FMDIMM, there may be a total of thirty six address/control/data support ASIC dice on a PCB, one in each package.

In comparison, the multi-chip packaged flash memory/support ASIC part 410 may have fewer pins that the MCP flash memory/support ASIC part 310A as the pass through bus 138 need not be supported by it. Instead, the data bus 438 is internal within the multi-chip packaged flash memory/support ASIC part 410. With fewer pins, the multi-chip packaged flash memory/support ASIC part 410 may cost less. The FMDIMM 300 may apply less parasitic load onto the edge connector 102 than the FMDIMM 400. However without the shared wider data bus, there is less routing traces on the printed circuit board as the data bus 138 is not used to pass data between parts in a slice. However, there is additional load and stubs applied to the DDR memory bus into which the FMDIMM plugs into. Moreover, there is still one clock cycle additional latency in the FMDIMM 400, due to the address registers 301-302.

Figure 5A:
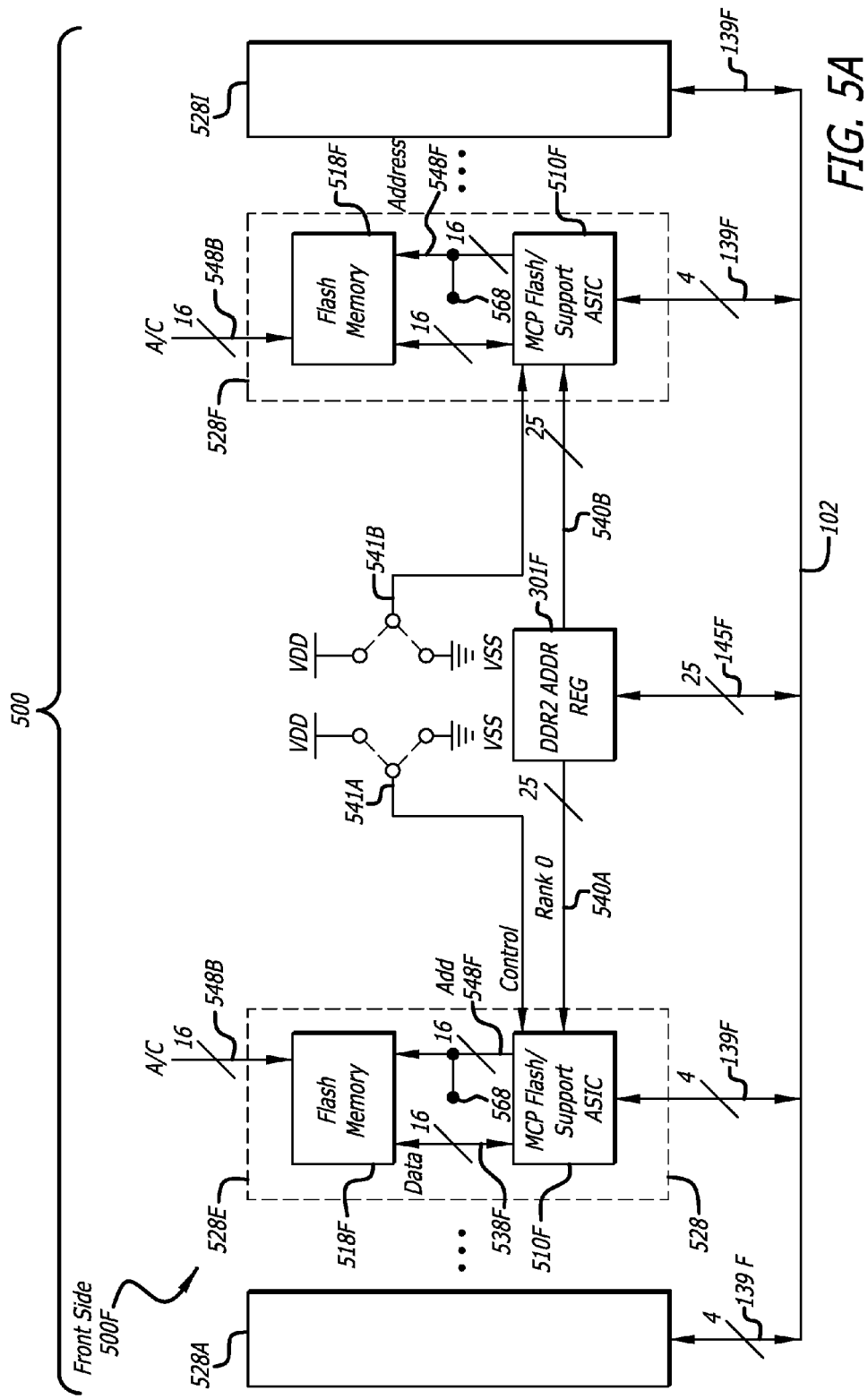
FIG. 5A is a functional block diagram of a front side of a flash DIMM with flash memory parts and multi-chip packaged flash memory/support ASIC parts.
Figure 5B:
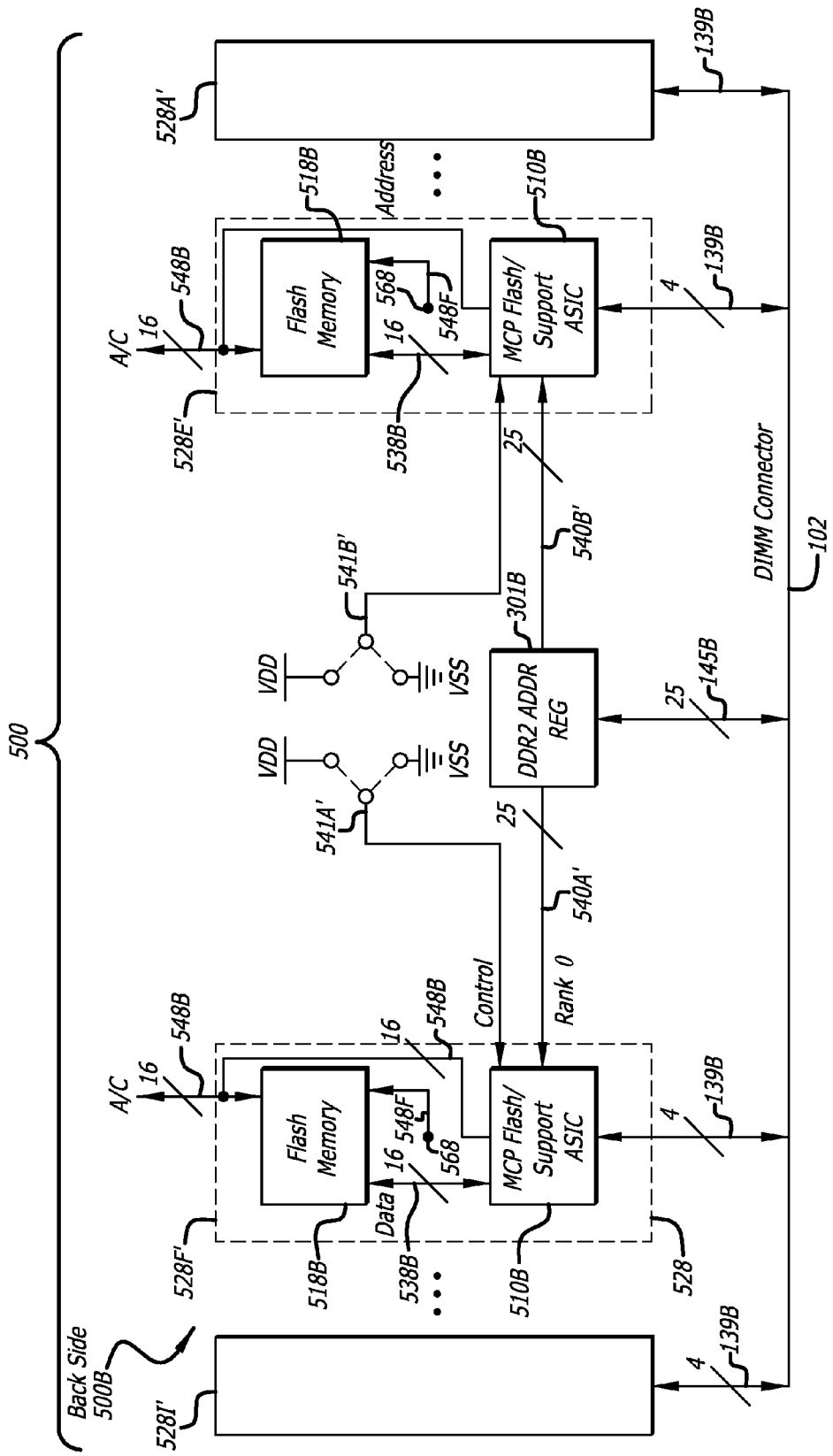
FIG. 5B is a functional block diagram of a back side of the flash DIMM of FIG. 5A.

Reference is now made to FIGS. 5A-5D. FIGS. 5A and 5B respectively represent a functional block diagram of a front side 500F and a back side 500B of another implementation of a FMDIMM 500. The front side 500F of the FMDIMM 500 includes multi-chip packaged flash memory parts 518F, and 518B, and multi-chip packaged flash memory/support ASIC parts 510F, and an address register 301F coupled together as shown. In one implementation, the address register 301F is an off-the-shelf or standard DDR2 memory address register. As the multi-chip packaged flash memory/support ASIC part 510F provides data, address, and control support, it may also be referred to as a multi-chip packaged flash memory/address, control, & data support ASIC part 510F.

The FMDIMM 500 includes a plurality of memory slices 528A-528I on one side and a plurality of memory slices 528I'-528A' on the other side of the FMDIMM 500. In one implementation, there are nine memory slices 528A-528I on the front side, and nine memory slices 528I'-528A' on the back side of the DIMM. A front side address register 301F may be connected to the nine front side packages 510F through the traces 540A-540B. A back side address register 301B may be connected to the nine back side packages 510B through the traces 540A'-540B'.

Each front side memory slice 528 includes a multi-chip packaged flash memory part 518F and a multi-chip packaged flash memory/support ASIC part 510F coupled together as shown by a pass through data bus 538F and a pass through address/control bus 548F. The front side address/control bus 548F in each slice is also routed through vias 568 to the back side of the FMDIMM 500 connecting to a multi-chip packaged flash memory part 518B on the back side. A back side address/control bus 548B may be routed from the back side to the front side of the FMDIMM 500 such as through vias or feed-throughs (or alternatively by wrapping around an edge of the PCB) and is coupled into the front side flash memory part 518F.

Front side data bus bits 139F, a subset of the respective data bits of the edge connector 102, are coupled to each of the multi-chip packaged flash memory/support ASIC parts 510F in each memory slice 528A-528I on the front side. Each memory slice couples to a respective subset of the total data bits at the edge connector of the DIMM. This may reduce the number of data bus signals routed over each side of the chip to reduce the size of the PCB, reduce the number of layers in the PCB, and/or reduce the loading on the edge connector 102. With the number of address lines routed across the FMDIMM being reduced as well, the size of the PCB and the number of layers in the PCB may be further reduced.

The front side address register 301F receives address lines from the connector 102 and registers an address or control signals that may be multiplexed on the address lines. The address register 301F can then drive out the address or control signals on the address/control lines 540A to the slices 528A-528E and address/control lines 540B to the slices 528F-528I coupling to the multi-chip packaged flash memory/support ASIC packaged parts 510F in each.

A front/back signal line 541A is coupled into the slices 528A-528E and a front/back signal line 541B to the slices 528F-528I coupling to the hybrid flash memory/ASIC packaged parts 510F in each. The front/back signal line 541A is tied to power (VDD) or to ground (VSS) in the package or externally. The front/back signal line 541A tells the memory support ASIC if it is to operate in a front mode or a back mode. The front/back signal line 541A signal will be used by the memory support ASIC to send upper or lower address bits to flash memory part 518F above it in the memory slice 528. The front/back signal line tells the ASIC 510F to send the upper 16 or lower 16 address bits to the flash memory packages 518 in the top rank. In one implementation, the front/back signal lines 541A-541B are tied to power VDD for the front side flash memory 518F and the front side hybrid part 510F to operate in a front side mode on the FMDIMM 500.

FIG. 5B illustrates a back side 500B of the PCB and the flash memory DIMM 500 mirroring the front side of the FMDIMM 500 so that the PCB traces are further reduced to minimize the size of the printed circuit board. The back side of the flash memory DIMM 500 includes back side flash memory parts 518B, hybrid flash memory/ASIC parts 510B, and an address register 301B coupled together as shown. In one implementation, the address register 301B is an off-the-shelf or standard DDR2 memory address register.

The back side memory slice 528A' on the right is parallel to the front side memory slice 528A. The back side memory slice 528I' on the left is parallel to the front size memory slice 528I. The flash memory parts 518F-518B may be mounted substantially in parallel to each other on opposite sides of the PCB. Similarly, the hybrid parts 510F and 510B may be mounted substantially in parallel to each other and the flash memory parts 518F and 518B on opposite sides of the PCB to minimize the length and number of PCB routing traces.

In each memory slice 528I'-528A', the front side address/control bus 548F is also routed through vias 568 to the back side of the FMDIMM 500 and coupled into the backside flash memory parts 518B. The back side address/control bus 548B generated by the back side hybrid flash memory/memory support ASIC part 510B is coupled into the back side flash memory part 518B and routed from the back side to the front side of the FMDIMM to couple into the front side flash memory part 518F.

A four bit data bus 139B of a respective four data bits of the connector 102 is coupled to the hybrid flash memory/ASIC packaged part 510B. With address lines routed across the FMDIMM being further reduced, the size of the PCB and the number of layers in the PCB may be reduced.

The address register 301B receives 20 address lines from the connector 102 and registers the address to then drive 20 address lines 540A' to the slices 528F'-528I' and 20 address lines 540B' to the slices 528A'-528E' coupling to the hybrid flash memory/ASIC packaged parts 510B in each. The address register and data support ASIC may be combined into one address and data support ASIC 510' in one implementation to further reduce the number of packages on the PCB (see FIG. 5D).

A front/back signal line 541A' is coupled into the slices 528A'-528E' and a front/back signal line 541B' to the slices 528F'-528I' coupling to the hybrid flash memory/ASIC packaged parts 510B in each. The front/back signal lines 541A'-541B' are similar to the front/back signal lines 541A-541B previously described. However in one configuration, the front/back signal lines 541A'-541B' are tied to ground VSS as illustrated for the back side flash memory 518B and the back side hybrid part 510B to operate in a back side mode on the FMDIMM 500.

The back side flash memory parts 518B, MCP flash memory/support ASIC parts 510B, and the address register 301B are mirror images of their front side counter parts 518F, 510F, 301F to reduce conductive traces on a printed circuit board of the memory module and the number of layers needed. That is, the pinouts are mirror images. A mirror imaged pinout may be accomplished in a number of ways.

In one implementation, the package for the flash memory part 518B may be constructed to use the same dice as used in the front flash memory part 518F, but the package for the back side flash memory part 518B may be internally wired differently to mount to the backside of the memory module and mirror the front side flash memory part 518F on a front side of the memory module.

In another implementation, the integrated circuit die for the back side may be altered from the front side die. That is, the pinout of the flash memory die for the back side parts 518B may be altered to mirror the pinout of the front side flash memory parts 518F. In one implementation, the layouts of the back side flash memory parts differ physically from the layouts of the front side flash memory parts to mirror the pinout. In another implementation, a front/back control signal may be tied logically high or low and used to electronically alter the pinout configuration to provide a mirrored pinout.

While the packages for the flash memory parts 518F and 518B have been described as having mirrored pinouts in different implementations, the multi-chip packaged flash memory/support ASIC parts 510F, 510B and the address register parts 301F, 301B may be similarly implemented to provide mirrored pinouts for the respective front and back sides of the FMDIMM 500.

For example, a front/back control signal 541A, 541B and 541A', 541B' may be used to electronically alter the pinout configuration of multi-chip packaged flash memory/support ASIC parts 510F, 510B to provide a mirrored pinout. In response to the front/back control signal, the chips electronically alter their pinout configurations by rerouting signal lines to different input/output pads on the chip. The front/back control signal 541A, 541B may be tied logically high to VDD routing the signals into a first routing pattern to provide a front side pinout for the multi-chip packaged flash memory/support ASIC parts 510F mounted to the front of the DIMM. The front/back control signal 541A', 541B' may be tied logically low to VSS routing the signals into a second routing pattern to provide a mirroring back side pinout for the multi-chip packaged flash memory/support ASIC parts 510B mounted to the back side of the DIMM.

Figure 5C:
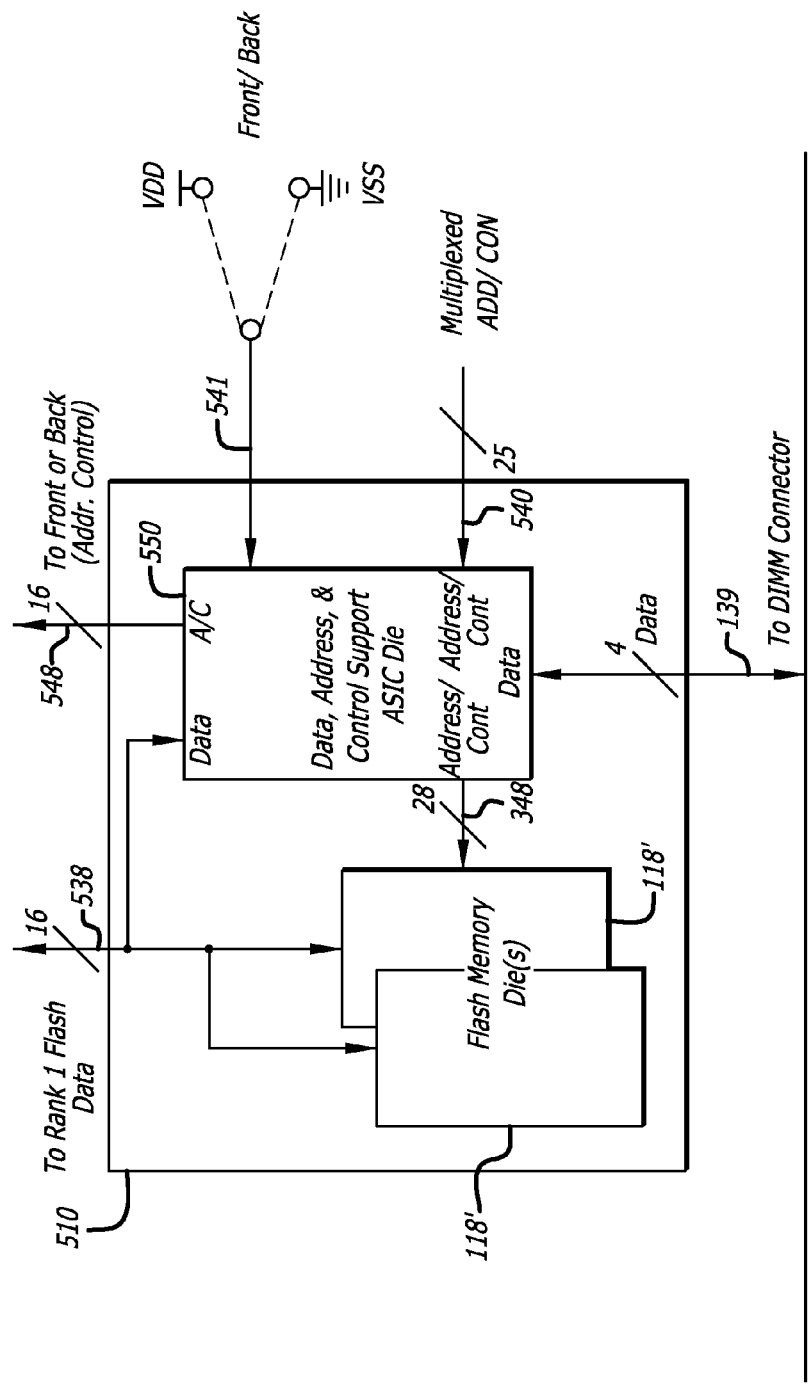
FIG. 5C is a functional block diagram of the multi-chip packaged flash memory/support ASIC part of FIGS. 5A-5B.

Referring now to FIG. 5C, a functional block diagram of the multi-chip packaged flash memory/support ASIC part 510 is illustrated. The multi-chip packaged flash memory/support ASIC part 510 includes one or more unpackaged flash memory dice 118' and an unpackaged address/control/data support ASIC die 550 coupled together as shown. The chips are mounted to a substrate of the multi-chip package with traces of the data bus 538 and the address bus 348 routed between each as illustrated. A plurality of data bus bits 139 and a plurality of address bus bits 341 are coupled to the address/control/data support ASIC die 550. The address/control buses 548F and 548B to Rank1 are shared between the front and back Rank zero flash memory packages 518 so each package only outputs one multiplexed address/control bus to reduce the pin count.

The address/control/data support ASIC die 550 has an address/control bus 548 that is shared with the flash memory chip 518 in each respective memory slice for addressing the top rank (rank one) of flash memory 518. The data bus 538 is extended out of the multi-chip package to be shared with the flash memory chip 518 in each respective memory slice as well.

A front/back signal line 541 is coupled into ASIC die 541. The front/back signal line 541 is tied to power (VDD) or to ground (VSS) in the package 510 or externally. The front/back signal line 541 tells the memory support ASIC 550 if it is to operate in a front mode or a back mode. The front/back signal line 541 signal will be used by the memory support ASIC to send upper or lower address bits to the flash memory part 518 above it in the memory slice 528. The front/back signal line tells the ASIC 550 to send the upper 16 or lower 16 address bits on the bus 548 to the flash memory packages 518 in the top rank.

As previously mentioned, a portion of the function of the address support ASIC 157 may be integrated with the function of the data support ASIC 155 into one chip, the address/control/data support ASIC chip 550. However with the extra functionality, the address/control/data support ASIC chip 550 requires extra input/output pins. Moreover, the address/control/data support ASIC chip 550 is functionally more complex with more gates and thus has a large die size and a greater cost. If implemented as a programmable logic device, it is a complex programmable logic device (CPLD). For two ranks with eighteen multi-chip packaged flash memory/support ASIC parts 510 in the bottom rank, there are a total of eighteen CPLD ASICs for one FMDIMM 500.

Additionally, with the pass through of data and addresses, the data latency into and out of the FMDIMM may be increased by one clock cycle.

In one implementation, the memory support ASIC 550 is integrated a multi-chip package such as a multi-chip module (MCM) integrated circuit package.

The FMDIMM 500 may use one standard off the shelf DDR2 address register part 301 for both ranks of memory. As the buses 538 and 548 can be readily routed between parts in each slice, it may be easy to route conductors between all of the parts mounted onto the PCB of the FMDIMM 500. This may result in area or space savings on the PCB to further reduce the size. Moreover, the flash memory 518 for the top rank, (rank one), may be packaged in a standard multi-chip module integrated circuit package. The package part 510 has extra pins added to its package to provide the pass-through of data, address, and controls to the flash memory part 518.

Figure 5D:
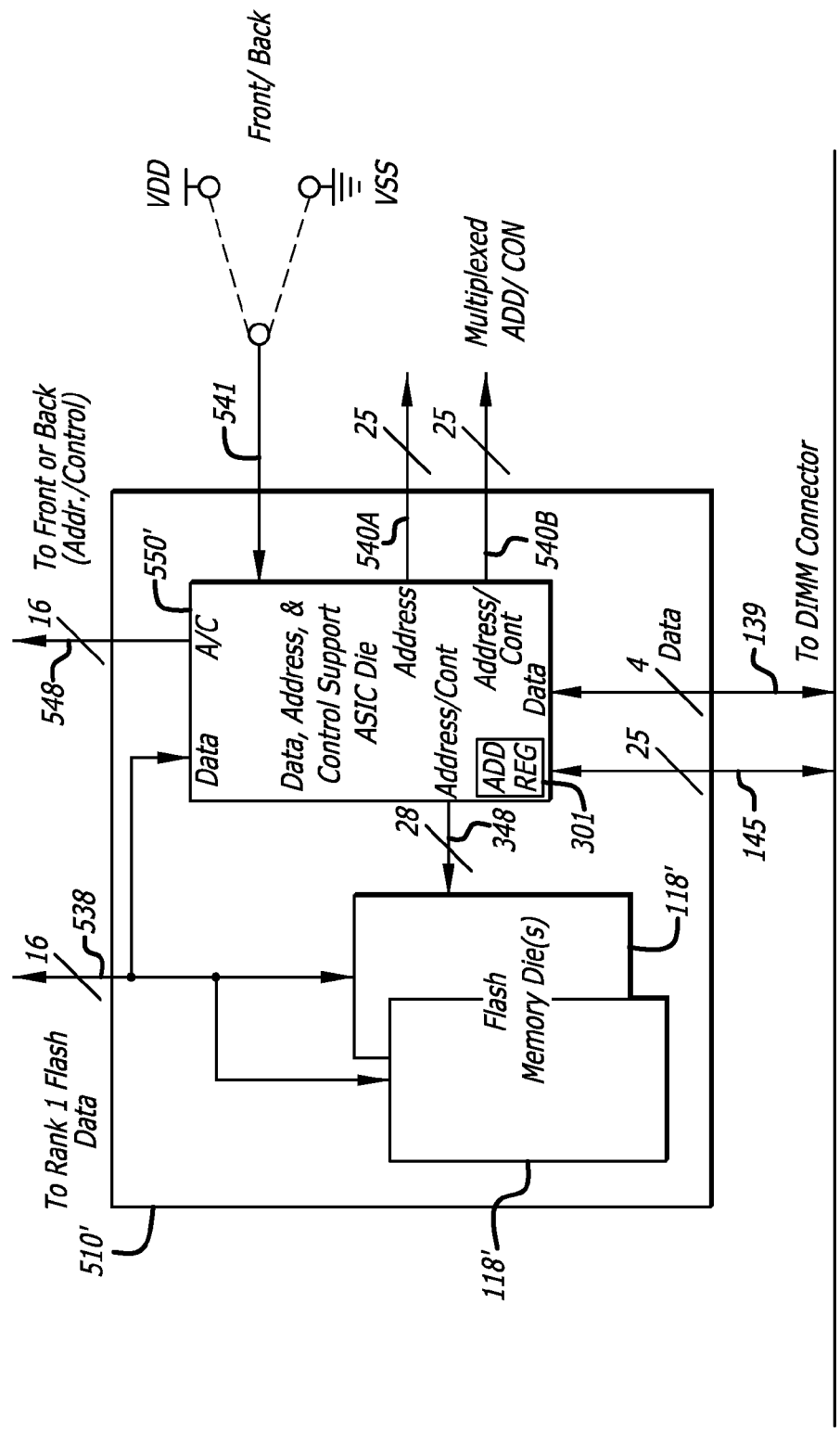
FIG. 5D is a functional block diagram of an optional multi-chip packaged flash memory/support ASIC part incorporating an address register.

Referring now to FIG. 5D, a functional block diagram of the multi-chip packaged flash memory/support ASIC part 510' is illustrated. The multi-chip packaged flash memory/support ASIC part 510' is similar to the multi-chip packaged flash memory/support ASIC part 510. However, the multi-chip packaged flash memory/support ASIC part 510' includes an integrated address register 301 to avoid the separate packaged address registers 301F and 301B in one implementation to further reduce the number of packages mounted on the PCB.

The ASIC die 550' receives the address bits 145 from the connector 120 and couples them into the address register 301. The ASIC die 550' buffers the address signals and drives them out onto the address lines 540A and 540B to the other multi-chip packaged flash memory/support ASIC parts 510 in the row.

If additional functionality is incorporated into the memory support ASIC to handle each row of flash memory parts on both front and back sides, the number of multi-chip packaged flash memory/support ASIC parts 510 mounted on the DIMM may be reduced. For two ranks with only nine multi-chip packaged flash memory/support ASIC parts in the bottom rank, there are a total of nine CPLD ASICs for one FMDIMM.

Figure 6:
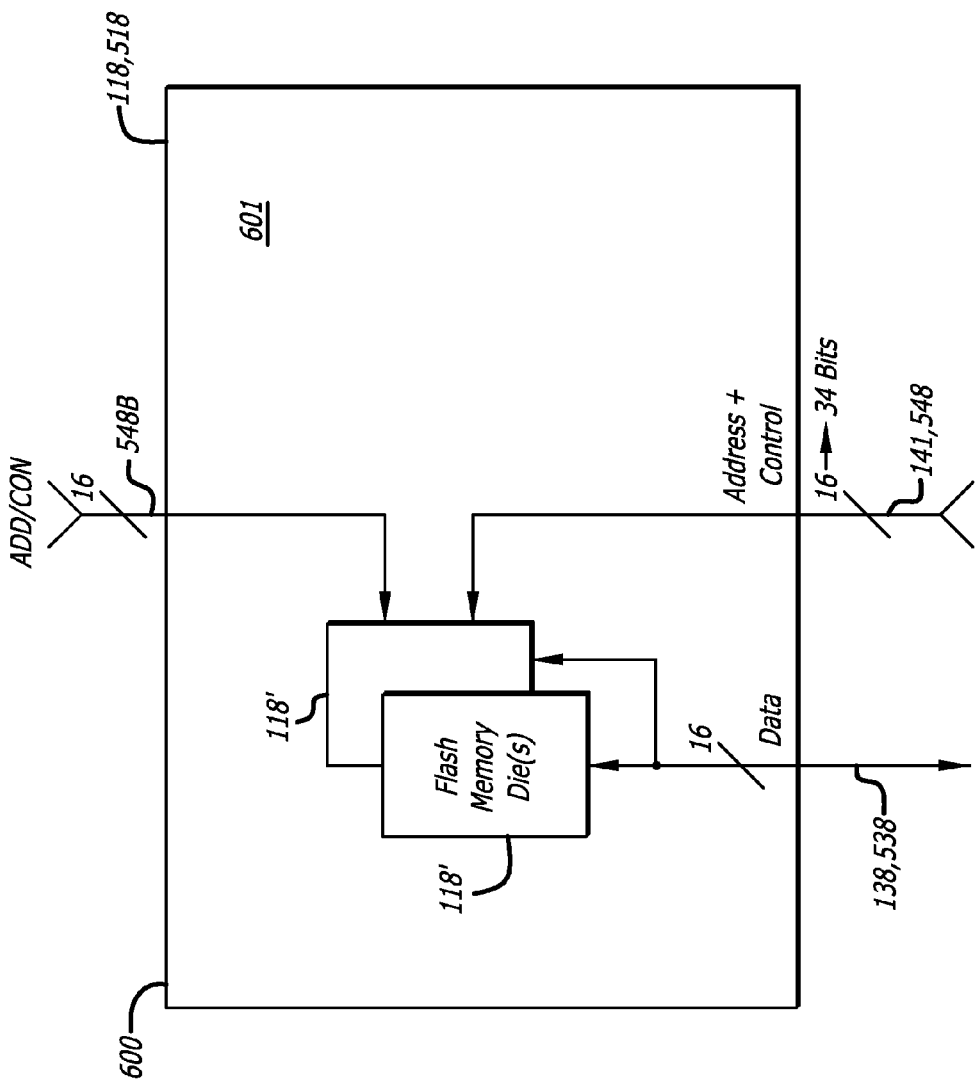
FIG. 6 is a functional block diagram of a multi-chip packaged flash memory part.

Referring now to FIG. 6, a block diagram of a multi-chip packaged flash memory part 118,518 is illustrated. The flash memory part includes one or more unpackaged flash memory die 118' (e.g., a monolithic semiconductor substrate) mounted to a package substrate 601 of an integrated circuit package 600. In one implementation, the integrated circuit package 600 is a standard multi-chip module integrated circuit package. Address and/or control lines 141,548F,548B are coupled to the one or more unpackaged flash memory dice 118'. Data lines 138,538 are also coupled to the one or more unpackaged flash memory dice 118'.

Referring now to FIGS. 8A and 8B represent a functional block diagram of a front side 800A and a back side 800B of an FMDIMM 800 is illustrated. The FMDIMM 800 includes multi-chip packaged flash memory parts 818F and 818B respectively on front and back side, multi-chip packaged flash memory/support ASIC parts 810F on the front side, and an address register 301 on the front side coupled together as shown. In one implementation, the address register 301F is an off-the-shelf or standard DDR2 memory address register. As the multi-chip packaged flash memory/support ASIC part 810F provides data, address, and control support, it may also be referred to as a multi-chip packaged flash memory/address, control, & data support ASIC part 810F.

The FMDIMM 800 includes a plurality of memory slices 828A-828I on one side (e.g., front side 800F) and a plurality of memory slices 828I'-828A' on the other side (e.g., back side 800B) of the FMDIMM 800. In one implementation, there are nine memory slices 828A-828I on the front side, and nine memory slices 828I'-828A' on the back side of the DIMM. The address register 301F is connected to the nine multi-chip packaged flash memory/support ASIC part 810F on via traces 840.

Each front side memory slice 828 includes a multi-chip packaged flash memory part 818F and a multi-chip packaged flash memory/support ASIC part 810F coupled together as shown by a pass through address low/data bus 838 and a pass through address high/control bus 848. The address high/control bus 848 is also routed through vias or feed-throughs 868 to the back side of the FMDIMM 800 connecting to the multi-chip packaged flash memory parts 818B mounted on the back side 800B in each respective slice. The address low/data bus 838 is also routed through vias or feed-throughs 869 to the back side of the FMDIMM 800 connecting to the multi-chip packaged flash memory parts 818B mounted on the back side 800B in each respective slice.

Data bus bits 139F of respective data bits of the connector 102 are coupled to the multi-chip packaged flash memory/support ASIC part 810F.

The address register 301F receives address lines from the connector 102 and registers the address to then drives address lines 840A to the slices 828A-828I coupling to the hybrid flash memory/support ASIC packaged parts 810F in each. With address lines routed across the FMDIMM being further reduced, the size of the PCB and the number of layers in the PCB may be reduced FIG. 8B illustrates a back side 800B of the PCB and the flash memory DIMM 800. The back side of the flash memory DIMM 800 includes back side flash memory parts 818B in each respective memory slice 828I'-828A' as shown. The memory slices 828I'-828A' on the back side mirror the memory slices 828A-828I on the front side so that the PCB traces to minimize the size of the printed circuit board.

The back side memory slice 828A' on the right is behind the front side memory slice 828A. The back side memory slice 828I' on the left is behind the front size memory slice 828I. The flash memory parts 818F and 818B may be mounted substantially in parallel to each other on opposite sides of the PCB. Similarly, the MCP flash memory/support ASIC parts 810F may be mounted substantially in parallel to flash memory parts 818B on opposite sides of the PCB to minimize the length and number of PCB routing traces.

In each memory slice 828I'-828A' on the back side 800B, the address high/control bus 848 and the address low/data bus 838 are routed from the front side to the back side through the vias or feedthroughs 868 and 869 respectively. On the back side 800B, portions of the address high/control bus 848 and the address low/data bus 838 are coupled into the two rows of backside flash memory parts 818B.

On the back side flash memory parts 818B, such as address/high control pins, may have signal assignments which mirror images of their front side counter parts to reduce conductive traces on a printed circuit board of the memory module and the number of layers needed. That is, one or more of the pin outs of the back side flash memory parts 818B are mirror images of the front side flash memory parts 818F. Various ways of implementing mirror imaged pinouts were previously described and are incorporated here by reference.

Figure 8C:
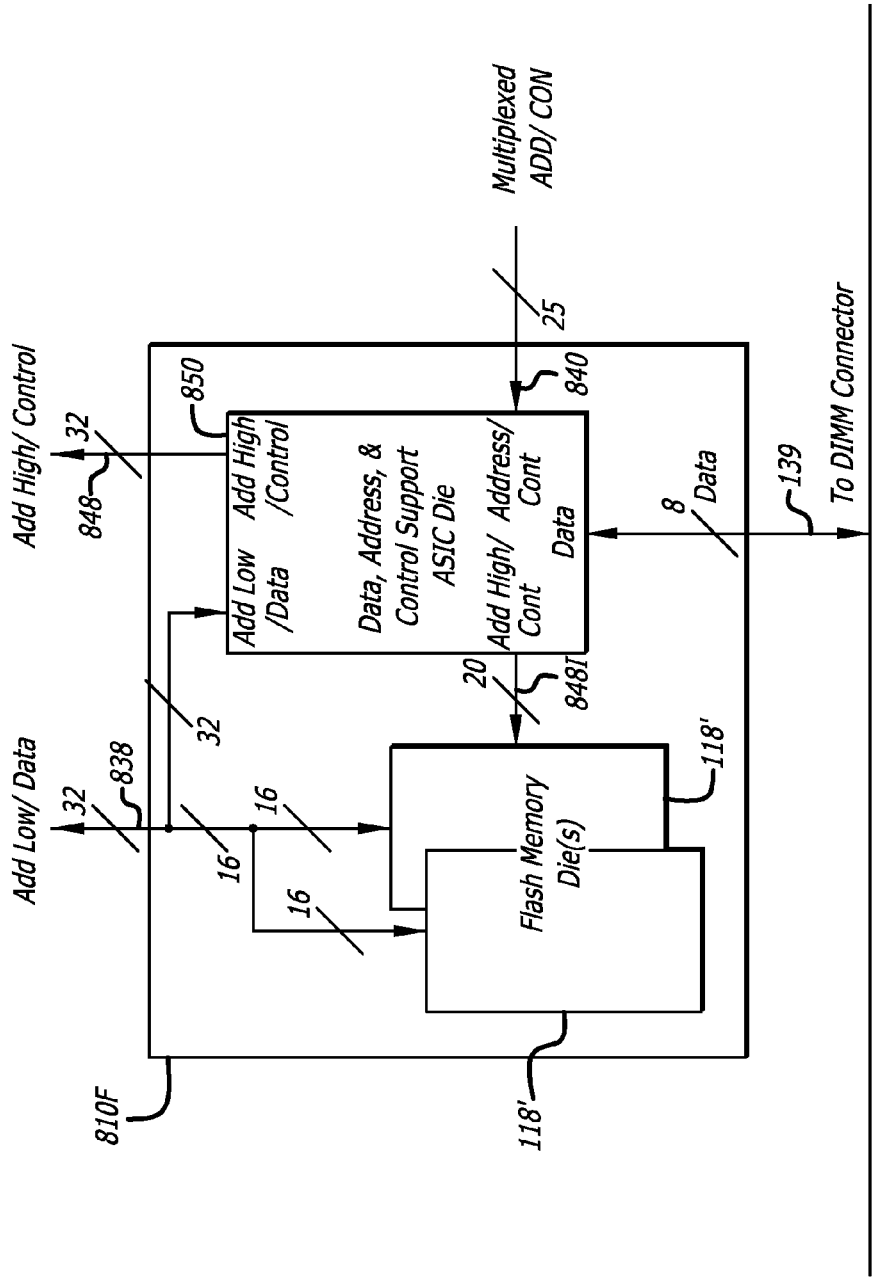
FIG. 8C is a functional block diagram of the multi-chip packaged flash memory/support ASIC part shown in FIG. 8A.

Referring now to FIG. 8C, a functional block diagram of the multi-chip packaged flash memory/support ASIC part 810 is illustrated. The multi-chip packaged part 810 includes one or more unpackaged flash memory dice 118' and an unpackaged address/control/data support ASIC die 850 coupled together as shown. The chips are mounted to a substrate of the multi-chip package with traces of the address low/data bus 838 and address high/control bus 848, 848I routed between each as illustrated. Data bus bits 139 and a multiplexed address/control bus 840 are coupled into the address/control/data support ASIC die 850.

The support ASIC 850 drives out the higher address bits and control bits directly to the flash memory die(s) over internal signal lines 848I while driving out higher address bits and control bits for the other front side flash memory packages 818F and the back side flash memory packages 818B on bus 848.

Within the FMDIMM 800, the row of components on the front and back sides closest to the edge connector 102 may be referred to as memory rank zero. The upper row of components on the front and back sides furthest away from the edge connector 102 may be referred to as memory rank one. There are separate control signals for each rank, and shared address high signal lines which are shared between the two memory ranks. For example, the subset of the bits of the address/control bus 848 which pertain to memory rank zero are shared between the front and back memory rank zero flash memory in the multi-chip packages 810 and 818B so that each package connects to one address/control bus to reduce the printed circuit board trace count. Similarly, a subset of the address/control bus which connects to rank one is respectively shared between the front and back rank one flash memory parts 818F and 818B.

The address/control/data support ASIC die 850 has an address/control bus 848 that is shared with the flash memory chip 818F on the front side and the flash memory packages 818B on the back side in each respective memory slice. The address low/data bus 838 is extended out of the multi-chip packaged integrated circuit package to be shared with the flash memory in the multi-chip packages 810 and 818F on the front side connecting to half the bus 838 and the multi-chip flash memory packages 818B on the back side connecting to the other half of the bus 838 in each respective memory slice as well.

As previously mentioned, a portion of the function of the address support ASIC 157 may be integrated with the function of the data support ASIC 155 into one chip, the address/control/data support ASIC chip 850. However with the extra functionality, the address/control/data support ASIC chip 850 requires extra input/output pins. Moreover, the address/control/data support ASIC chip 850 may be functionally more complex with more gates and thus may have a large die size and be manufactured at greater cost. If implemented as a programmable logic device, it is a complex programmable logic device (CPLD). For two ranks with nine MCP flash memory/support ASIC parts 810 in the bottom rank, there are a total of nine CPLD ASICs for one FMDIMM 800.

Additionally, with the pass through of data and addresses through the Data, Address and Control support ASIC die 850, the data latency into and out of the FMDIMM may be increased by one or more clock cycles.

The FMDIMM 800 may use one standard off the shelf DDR2 address register part 301 for both ranks of memory. As the address register part 301 connects to the front support ASIC parts 810, and as buses 838 and 848 are routed between parts in each slice, there may be area or space savings on the PCB to further reduce its size. Moreover, the flash memory parts 818F on the front side and the flash memory parts 818B on the back side may be packaged in a multi-chip package. The multi-chip packaged flash memory/support ASIC part 810 has extra pins added to its package to provide data pass-through of data signals, address pass-through of address signals, and control pass-through of control signals to the flash memory parts 818F,818B.

Figure 8D:
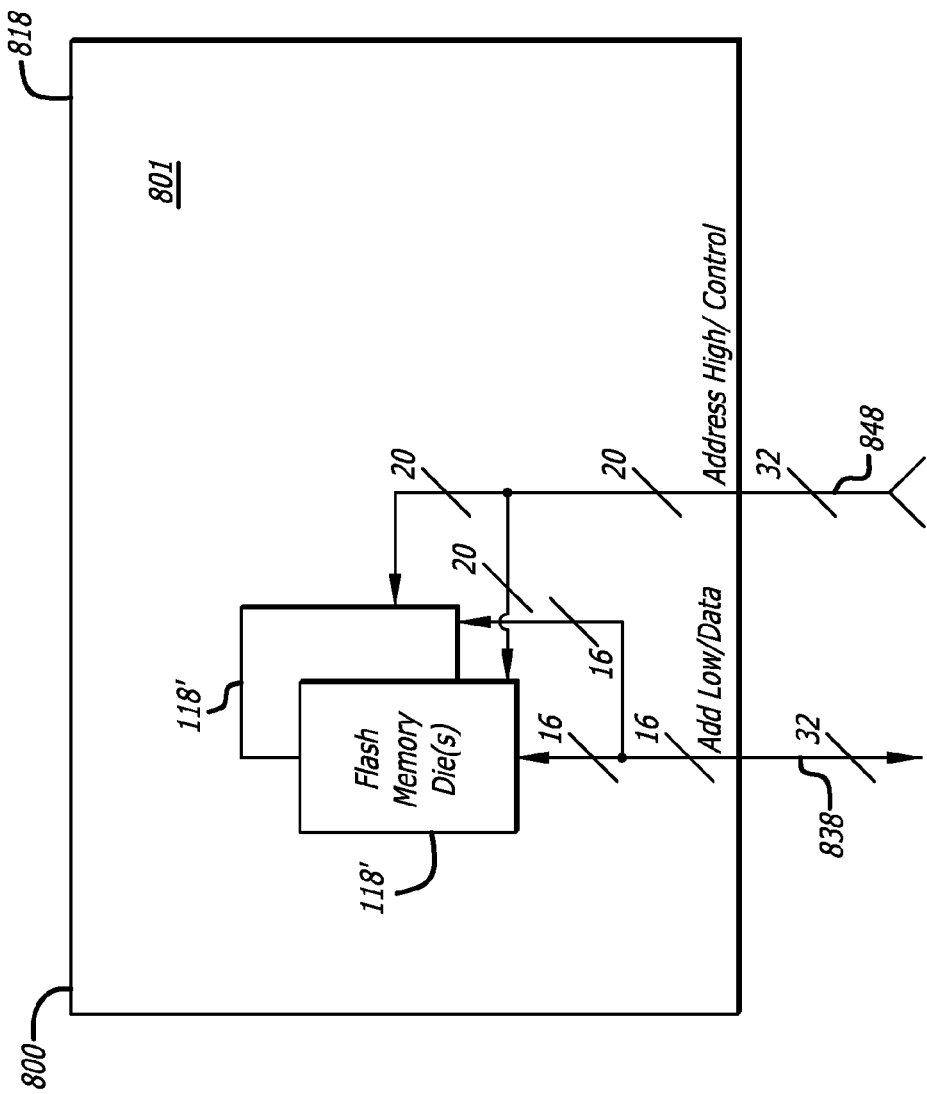
FIG. 8D is a functional block diagram of a multi-chip packaged flash memory part for the flash memory DIMM of FIGS. 8A-8B.

Referring now to FIG. 8D, a block diagram of a multi-chip packaged flash memory part 818 is illustrated. The flash memory part 818 includes one or more unpackaged flash memory die(s) 118' (e.g., a monolithic semiconductor substrate) mounted to a package substrate 801 of an integrated circuit package 800. The flash memory dice may be NOR-gate flash electrically erasable programmable read only memory (EEPROM) integrated circuit in some implementations.

In one implementation, the integrated circuit package 800 may be a multi-chip module integrated circuit package. Selected address/control lines of the address high/control bus 848 are coupled into the one or more unpackaged flash memory dice 118' depending upon the mounting (front or back) of the part 818 and the rank of memory (e.g., rank one or zero) it is to operate on the DIMM. Selected address/data lines of the address low/data bus 838 are also coupled into the one or more unpackaged flash memory dice 118' depending upon the mounting (front or back) of the part 818 and the rank of memory (e.g., rank one or zero) it is to operate on the DIMM.

Figure 9:
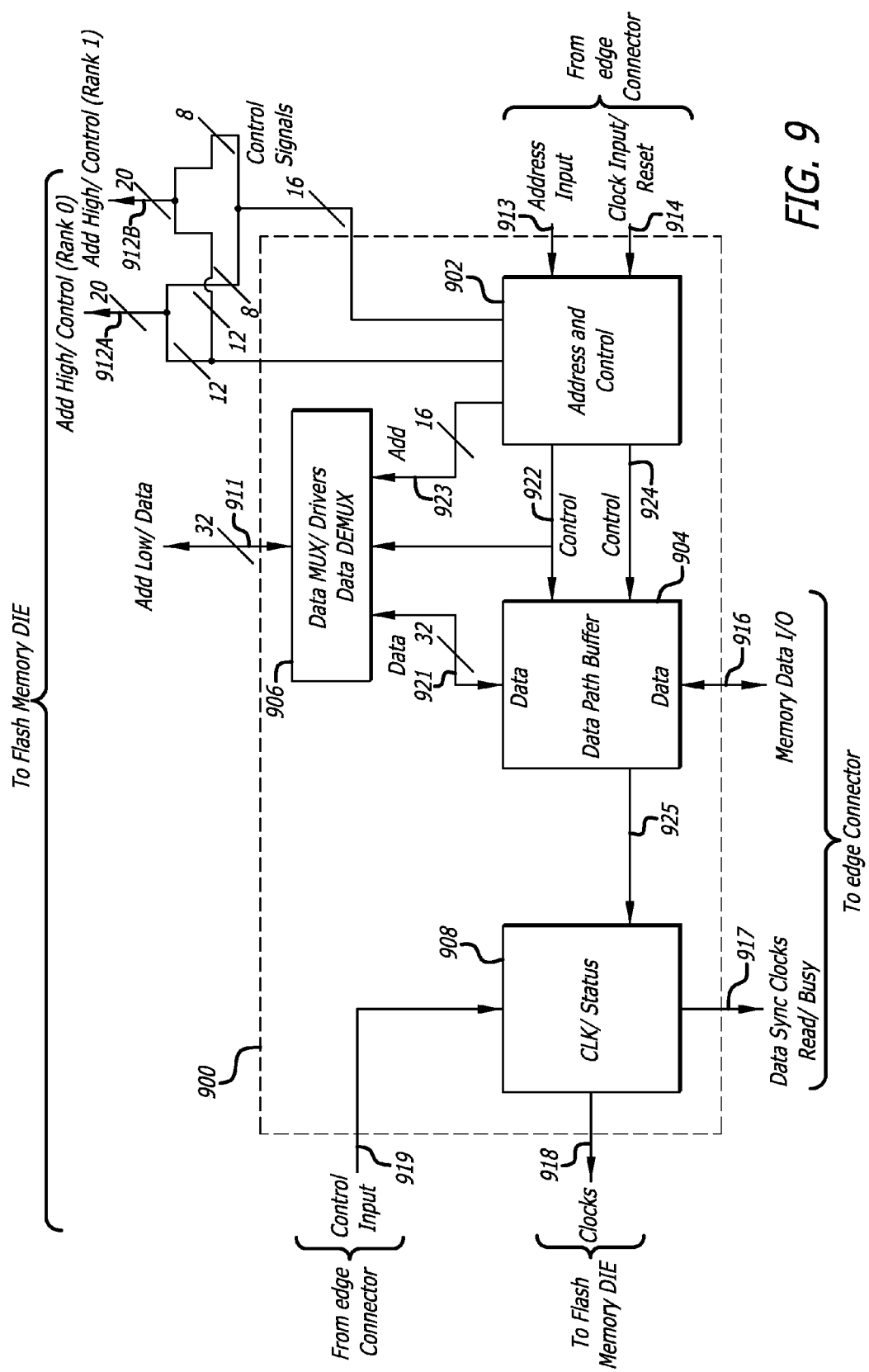
FIG. 9 is a functional block diagram of a memory support ASIC die to provide data, address, and control support.

Referring now to FIG. 9, a functional block diagram of a flash memory support ASIC die 900 is illustrated. The flash memory support ASIC die 900 may provide data, address, and control support for the flash memory on a DIMM. The flash memory support ASIC die 900 includes an address/control block 902, a data path buffer 904, a data multiplexer/de-multiplexer 906, and clock/status block 908 coupled together as shown.

The address/control block 902 is coupled to the address/control bus 913 to receive input addresses and control signals that may be multiplexed thereon. The address/control block 902 may further be coupled to control signal lines 914 to further receive clock signals to synchronize address and data and generate control signals at the appropriate moments. In response to the input signals 913 and 914, the address/control block 902 generates control signals 924 coupled to the data path buffer 904 to store data into and/or write data out therefrom. The address/control block 902 further generates control signals 922 coupled to the multiplexer/de-multiplexer 906 and the data path buffer 904 to synchronously control their functional operations. The address/control block 902 further generates addresses and control signals onto a pair of external address high/control buses 912A-912B for memory ranks zero and one, as well as address signals on the internal address bus 923 to couple them into the multiplexer/de-multiplexer 906 for multiplexing onto the external address low/data bus 911 as required.

Some types of flash memory integrated circuits, such as NOR FLASH EEPROM integrated circuits, may be configured so that read access times (where an address is presented and data returned) may be reduced to levels sufficient for use in main memory of computer systems. However, read and write operations to flash memory may be asymmetric. A data write operation into flash memory may take much more time than a data read operation from flash memory. A data erase operation in flash memory may also take much more time than a data read operation.

The data path buffer 904 may be used to store data so that the asymmetry in read and write operations with flash memory may be emolliated. Data may be quickly written into the data path buffer 904 and then controlled to program large amounts of data into the flash memory at another moment in time. Similarly, a plurality of data read operations into flash memory may be made with data being stored into the data path buffer 904. The data may be read out in bursts from the data path buffer. Additionally, signal timing differences between a data bus to the flash memory die and an external data bus to the edge connector of a DIMM may be emolliated by the buffering provided by the data path buffer 904. For example, the data bus 911 coupled to flash memory dice and consequently internal data bus 921 may have data clocked in/out every twenty nano-seconds (ns) while the data bus 916 coupled to the edge connector may have data clocked in and out data every five nano-seconds. The buffering provided by the data path buffer 904 can smoother over these timing differences so they are transparent to each of the flash memory dice coupled to bus 911 and the devices coupled to bus 916 through the edge connector.

The data path buffer 904 is a data buffer includes memory, registers or other data storage means for each data bus 916 and 921 coupled to it to provide the buffering.

The parallel bits (e.g., eight) of the data bus 916 coupled into the data path buffer 904 may be less than the parallel bits (e.g., thirty-two) of internal data bus 921 coupled to the multiplexer/de-multiplexer 906. The data path buffer 904 facilitates packing data into wider bit widths for storage into one or more flash memory parts and unpacking the wide data bytes read out from one or more flash memory parts into narrower data bytes for reading over a fewer number of bits of the external memory input/output data bus 916.

The multiplexer/de-multiplexer 906 is coupled to the data buffer 904 over the internal data bus 921 and the address and control block 902 over the internal address bus 923. The multiplexer/de-multiplexer 906 further receives control signals 922 from the address and control block 902 to control its multiplexing/demultiplexing functions. The multiplexer/de-multiplexer 906 is further coupled to the multiplexed address low/data bus 911 that is coupled to flash memory dice.

The multiplexer/de-multiplexer 906 includes a many-to-one bus multiplexer and a one-to-many bus de-multiplexer jointly functioning similar to a cross-bar switch. A cross-bar switch may be alternatively used to implement the functions of the many-to-one bus multiplexer and the one-to-many bus de-multiplexer.

The many-to-one bus multiplexer allows a large amount of data to be read accessed in parallel, and then transferred out through the data path buffer 904 over a narrower data bus in a burst of cycles. The one-to-many bus demultiplexer in conjunction with the data path buffer 904 may be used over a burst of cycles to receive parallel data of a narrower width from the external data bus and to write out the aggregated data out to the flash memory die.

The bus multiplexing provided by the multiplexer/de-multiplexer 906 allows extra flash memory dice to be stacked up behind the ASIC support chip on each side of the DIMM so that is has a greater memory capacity available than otherwise possible without the support chips. The use of the memory support ASIC chip avoids adding extra capacitive loading onto a memory channel bus from the extra flash memory dice in the memory module.

The clock/status block 908 is coupled to the data path buffer 904 to receive control signals and status information 925 regarding data being written out from the support ASIC 900 onto the external memory data input/output bus 916. The clock/status block 908 further receives input control signals 919. The clock/status block 908 may generate clock signals 918 to couple to the flash memory dice to synchronize the signal timing on the buses 911 and 912A-912B coupled to the flash memory dice. The clock/status block 908 further generates data synchronization clocks and a ready/busy signal(s) 917 to be provided over the edge connector to synchronize the signal timing on the data bus 916 for data driven out from the data path buffer 904.

The ready/busy signal(s) of the control signals 917 is a status signal and provides status of a requested operation with the flash memory. The ready/busy signal may be generated by the clock/status block 908 of the support ASIC 900 so that so that the flash memory dice may be more efficiently accessed. The status signal may indicate whether or not the flash memory coupled to the support ASIC is busy or ready for another write or erase access to alleviate the non-deterministic nature of erase and write operations to flash memory. The control input signals 919 may be used to determine what information a support ASIC die reports in the clock/status block 908.

In one implementation, the memory support ASIC is integrated with flash memory into a multi-chip package (MCP).

Figure 7A:
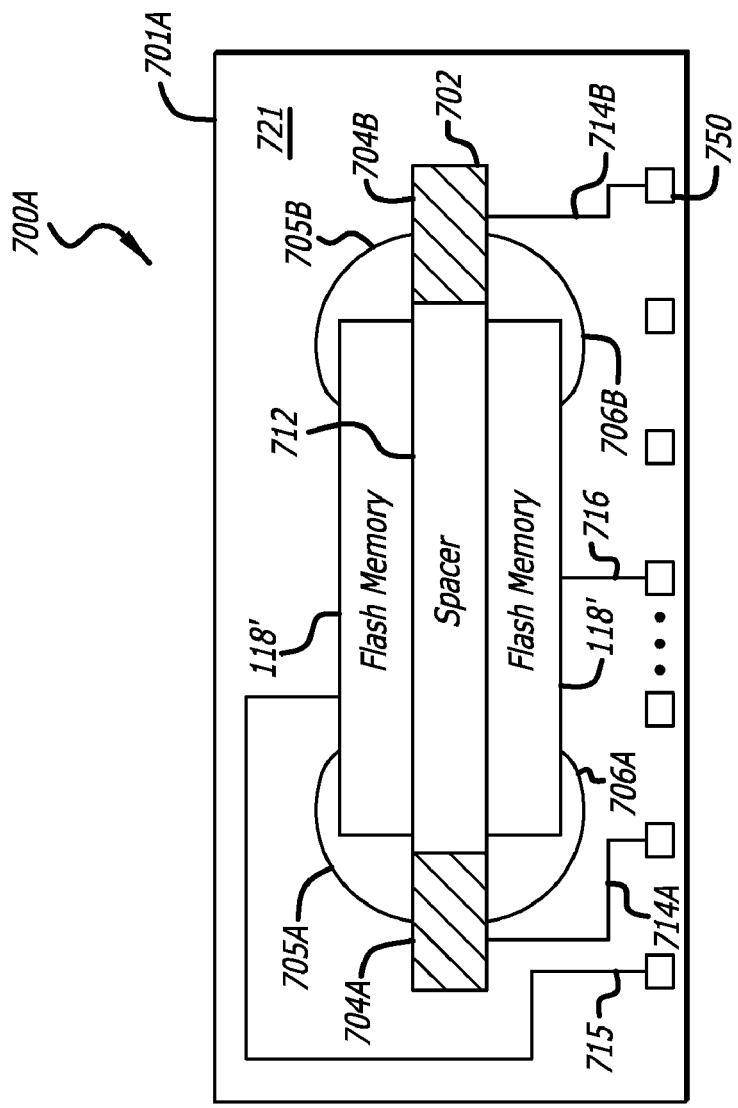
FIG. 7A is a side cutaway view of a first multi-chip packaged flash memory/support ASIC part.

Referring now to FIG. 7A, a side cutaway view of a multi-chip packaged flash memory/support ASIC part 700A is illustrated. Previously, multi-chip packages may have been referred to as hybrid packages or multi-chip module packages. Mounted in the package 701A is a top flash memory die 118', a combined spacer/memory support ASIC die 702, and a lower flash memory die 118'.

The spacer/memory support ASIC die 702 includes a spacer 712 in a middle portion and active devices 704A-704B near outer portions beyond the dimensions of the top and bottom flash memory die 118'. The spacer 712 may be a dielectric or insulator so that the active devices 704A-704B of the spacer/memory support ASIC die 702 do not short to any circuitry of the flash memory die 118'. Otherwise, the middle portion does not include any active devices or metal routing near its surfaces so that it can act as a non-shorting spacer to the top and bottom flash memory die. Metal routing or interconnect may be buried and insulated in the spacer 712 in the middle portion of spacer/memory support ASIC die 702 to couple active devices 704A-704B in the outer portions together.

Conductors 705A-705B may couple the top flash memory die 118' to the active portions 704A-704B of the memory support ASIC die 702. Conductors 706A-706B may couple the bottom flash memory die 118' to the active portions 704A-704B of the combined spacer/memory support ASIC die 702. Conductors 714A-714B may couple the combined spacer/memory support ASIC die 702 to pin-out connections 750. Conductors 715-716 may respectively couple the top and bottom flash memory die 118' to the pin-out connections 750.

An encapsulant 721 may be used to protect the devices mounted in the package 701A and keep conductors from shorting to each other.

Figure 7B:
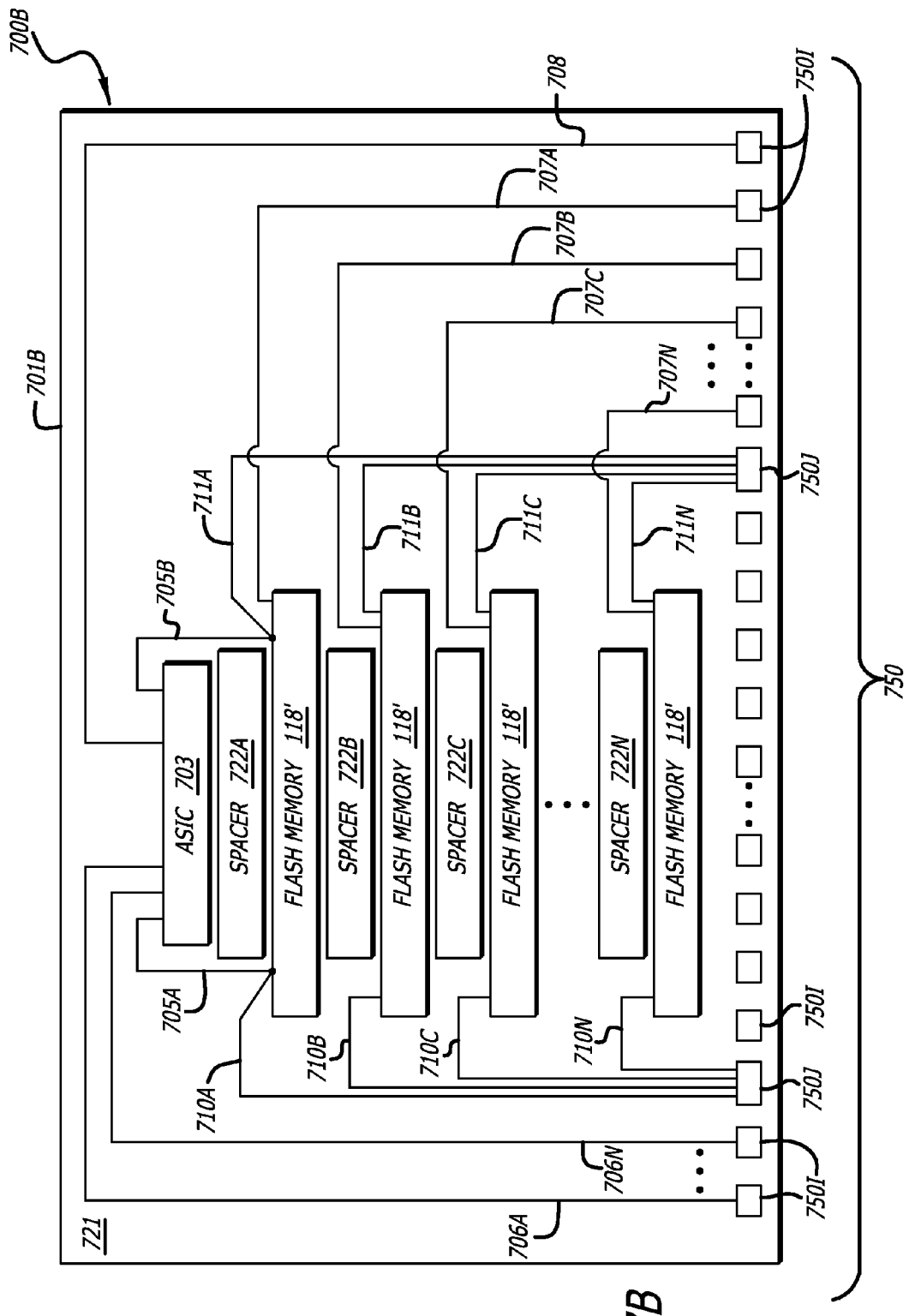
FIG. 7B is a side cutaway view of a second multi-chip packaged flash memory/support ASIC part.

Referring now to FIG. 7B, a side cutaway view of a multi-chip packaged flash memory/support ASIC part 700B is illustrated. Mounted in the multi-chip module package 701B is a memory support ASIC die 703, and pairs of a spacer and a flash memory die including a first spacer 722A and a first flash memory die 118', a second spacer 722B and a second flash memory die 118', a third spacer 722C and a third flash memory die 118', and an Nth spacer 722N and an Nth flash memory die 118' stacked together as shown.

The spacer 722A may be the size of the support ASIC 703 as shown or somewhat smaller than the size of the flash memory 118' so that contacts may be made to the support ASIC die 703 and the first flash memory die 118'. The flash memory die 118' is larger than the spacers 722B-722N to provide an opening into a perimeter of the flash memory dice 118' so that electrical connections may be made.

In other implementations, the spacer may be applied after a flash die 118' is connected to a substrate of the package. The spacer may cover the areas on the flash memory die 118' to which it was connected.

The spacers 722A-722N may be a dielectric or insulator so that the memory support ASIC die 703 and flash memory dice 118' do not short out to each other. Otherwise, the spacers do not include any active devices or metal routing, unless buried under the surface, so that it will not short wires or signal lines together.

The support ASIC and the flash memory dice 118' may be coupled together at joint package pads/pins 750J. For example, conductors 705A and 705B may couple signals of the support ASIC die 703 to a connection on the top flash memory die 118' and thence to the joint package pads 750J by means of conductors 710A and 711A respectively. Connections on other levels of flash memory die 118' may couple to the same joint package pad 750J by conductors 710B-710N and 711B-711N respectively. That is, the other flash memory dies 118' are connected to the ASIC die by way of multiple connections to the joint package pads/pins 750J.

The memory support ASIC 703 and each flash memory dice 118' may directly and independently couple to independent package pads/pins 750I of the package. For example, the support ASIC die 703 may couple to independent package pads/pins 750I by means of conductors 706A-706N and 708. The N flash memory dice 118' may directly and independently couple to their own respective independent package pads/pins 750I by means of conductors 707A-707N. The conductors 707A-707N coupled to the respective independent package pads/pins 750I may be a chip enable signal to activate the flash memory die or not.

An encapsulant 721 may also be used to protect the devices mounted in the package 701B and keep conductors from shorting to each other.

The FMDIMMs descried herein may be used to swap out one or more DRAM memory modules in a memory channel to reduce average power consumption in main memory of a system. In this case, the FMDIMMs are plugged into the one or more sockets replacing DRAM memory modules in the respective memory channel.

Certain exemplary embodiments of the invention have been described and shown in the accompanying drawings. It is to be understood that such embodiments are merely illustrative of and not restrictive on the broad invention, and that the embodiments of the invention not be limited to the specific constructions and arrangements shown and described.

For example, the flash memory DIMMs were described herein and illustrated with reference to bit widths of address busses, bit widths of data busses, and in some instances, bit widths of control busses. However, the embodiments of the invention may be applied to a wide range of bit widths of address busses, data busses, and control busses, and therefor must not be so limited.

Moreover, the flash memory DIMMS were described herein as having a multiplexed address low/data bus. Other implementations may not share the address low bits on the data bus but may increase the size of the address high/control bus to carry the entire address separate from the data bus Additionally, the flash memory DIMMS were described herein as sharing the address high bus between memory ranks on the FMDIMM. Other implementations may not share the address high bus between ranks but may have separate address busses for each rank of memory on the FMDIMM.

While flash memory DIMM has been used to describe the embodiments of the invention, the embodiments of the invention may be applied to any memory module incorporating a non-volatile memory device.

Rather, the embodiments of the invention should be construed according to the claims that follow below.

What is claimed is:

1. A flash memory dual inline memory module (DIMM) comprising:
    a printed circuit board with an edge connector;
    a first plurality of multi-chip packaged flash memory/support application specific integrated circuit (ASIC) parts mounted to the printed circuit board and electrically coupled to the edge connector, each of the first plurality of multi-chip packaged flash memory/support ASIC parts including
        one or more randomly accessible flash memory die to periodically store data in a non-volatile manner, wherein the one or more randomly accessible flash memory die operate with a power supply voltage level differing from a power supply voltage level to be provided at the edge connector, and
        one or more circuits to convert one or more voltages to that used to operate the randomly accessible flash memory die to avoid mounting power conversion circuit to the printed circuit board and increasing the height thereof;
    and
    a first address device mounted to the printed circuit board and electrically coupled to the edge connector and the first plurality of multi-chip packaged flash memory/support ASIC parts.

2. The flash memory DIMM of claim 1, wherein
    the printed circuit board includes a plurality of metal traces on one or more layers of the printed circuit board, the plurality of metal traces to electrically couple to the edge connector and the plurality of multi-chip packaged flash memory/support ASIC parts, and the plurality of metal traces include traces for power, ground, address signals, and data signals.

3. The flash memory DIMM of claim 1, further comprising:
    a plurality of flash memory parts mounted on a surface of the printed circuit board and respectively coupled to the first plurality of multi-chip packaged flash memory/support ASIC parts, each of the plurality of flash memory parts including one or more randomly accessible flash memory die to periodically store data in a non-volatile manner.

4. The flash memory DIMM of claim 3, wherein
    data associated with the plurality of flash memory parts mounted on the surface of the printed circuit board passes through the first plurality of multi-chip packaged flash memory/support ASIC parts to/from the edge connector.

5. The flash memory DIMM of claim 3, wherein
    the first plurality of multi-chip packaged flash memory/support ASIC parts and the first address device are mounted to a front side of the printed circuit board; and
    the plurality of flash memory parts are mounted to a back side of the printed circuit board.

6. The flash memory DIMM of claim 1, further comprising:
    a second plurality of multi-chip packaged flash memory/support ASIC parts mounted to the printed circuit board and electrically coupled to the edge connector, each of the second plurality of multi-chip packaged flash memory/support ASIC parts including one or more randomly accessible flash memory die to periodically store data in a non-volatile manner; and
    a second address device mounted to the printed circuit board and electrically coupled to the second plurality of multi-chip packaged flash memory/support ASIC parts;
    wherein the first plurality of multi-chip packaged flash memory/support ASIC parts and the second plurality of multi-chip packaged flash memory/support ASIC parts are mounted in parallel rows on the printed circuit board.

7. The flash memory DIMM of claim 6, wherein
    data associated with the second plurality of multi-chip packaged flash memory/support ASIC parts bypasses the first plurality of multi-chip packaged flash memory/support ASIC parts to/from the edge connector.

8. The flash memory DIMM of claim 1, further comprising:
    a second plurality of multi-chip packaged flash memory/support ASIC parts mounted to the printed circuit board and electrically coupled to the first plurality of multi-chip packaged flash memory/support ASIC parts, each of the second plurality of multi-chip packaged flash memory/support ASIC parts including one or more randomly accessible flash memory die to periodically store data in a non-volatile manner; and
    a second address device mounted to the printed circuit board and electrically coupled to the first address device and the second plurality of multi-chip packaged flash memory/support ASIC parts;
    wherein the first plurality of multi-chip packaged flash memory/support ASIC parts and the second plurality of multi-chip packaged flash memory/support ASIC parts are mounted in parallel rows on the printed circuit board.

9. The flash memory DIMM of claim 8, wherein
    data associated with the second plurality of multi-chip packaged flash memory/support ASIC parts respectively passes through the first plurality of multi-chip packaged flash memory/support ASIC parts to/from the edge connector.

10. The flash memory DIMM of claim 1, wherein
each of the first plurality of multi-chip packaged flash memory/support ASIC parts further includes an application specific integrated circuit (ASIC) die mounted to a substrate, and
the one or more randomly accessible flash memory die are mounted to the substrate and electrically coupled to the ASIC die.

11. The flash memory DIMM of claim 10, wherein
the ASIC die is
a data support application specific integrated circuit die to read data from and write data into the one or more randomly accessible flash memory die.

12. The flash memory DIMM of claim 10, wherein
the ASIC die is
an address, control, and data support application specific integrated circuit die to receive one or more address lines and generate an address for the one or more randomly accessible flash memory die and generate control signals to control the randomly accessible flash memory die to read data there-from and write data there-to.

13. The flash memory DIMM of claim 1, wherein
each of the first plurality of multichip packaged flash memory/support ASIC parts further includes
a first multiplexer/demultiplexer to respectively multiplex and demultiplex data between a first data bus of a first bit width and a second data bus of a second bit width differing from the first bit width.

14. The flash memory DIMM of claim 13, wherein
the first address device to receive an encoded address from the edge connector to decode the encoded address and address at least one of the one or more randomly accessible flash memory die and at least one flash memory location therein.

15. The flash memory DIMM of claim 13, wherein
the first plurality of multi-chip packaged flash memory/support ASIC parts are mounted in a first row on the printed circuit board and the flash memory DIMM further comprises:
a second plurality of flash memory parts mounted to the printed circuit board in a second row parallel to the first row and electrically coupled to the first multi-chip packaged flash memory/support ASIC parts and the first address device, each of the second plurality of flash memory parts including one or more randomly accessible flash memory die to periodically store data in a non-volatile manner.

16. The flash memory DIMM of claim 15, wherein
the first plurality of multi-chip packaged flash memory/support ASIC parts includes a first left plurality of multi-chip packaged flash memory/support ASIC parts and a first right plurality of multi-chip packaged flash memory/support ASIC parts in the first row;
the second plurality of flash memory parts includes a first left plurality of flash memory parts and a first right plurality of flash memory parts in the second row; and
the first address device is between the first left and first right plurality of multi-chip packaged flash memory/support ASIC parts to drive a first left and a first right plurality of address lines respectively thereto and between the first left and first right plurality of flash memory parts to drive a second left and a second right plurality of address lines respectively thereto.

17. The flash memory DIMM of claim 13, wherein
each of the one or more randomly accessible flash memory die in the first plurality of multi-chip packaged flash memory/support ASIC parts and an application specific integrated circuit (ASIC) die to which they are coupled are respectively mounted together into a first plurality of multi-chip packages and to a front side of the printed circuit board;
the first address device is mounted to the front side of the printed circuit board;
the ASIC die to couple to a first plurality of pins of the edge connector on the front side of the printed circuit board; and
the flash memory DIMM further includes
a second plurality of multi-chip packaged flash memory/support ASIC parts coupled to a second plurality of pins of the edge connector on the back side of the printed circuit board, each of the second plurality of multi-chip packaged flash memory/support ASIC parts including a second multiplexer/demultiplexer to respectively multiplex and demultiplex data between a third data bus of a third bit width and a fourth data bus of a fourth bit width differing from the third bit width;
a second plurality of flash memory parts coupled to the second plurality of multi-chip packaged flash memory/support ASIC parts and a second address device, the second plurality of plurality of multi-chip packaged flash memory/support ASIC parts including one or more randomly accessible flash memory die to periodically store data in a non-volatile manner;
the second address device coupled to the edge connector, the second plurality of flash memory parts, and the second plurality of multi-chip packaged flash memory/support ASIC parts; and
wherein the second plurality of flash memory parts, the second plurality of multi-chip packaged flash memory/support ASIC parts, and the second address device are respectively mounted to a back side of the printed circuit board.

18. The flash memory DIMM of claim 13, wherein
each of the first plurality of multi-chip packaged flash memory/support ASIC parts further includes
a data buffer to buffer data between the first data bus and the second data bus to emolliate signal timing differences between the first data bus and the second data bus.

19. The flash memory DIMM of claim 1, wherein
the power supply voltage level to be provided at the edge connector is one of 2.5 volts, 1.8 volts, and 1.5 volts.

20. A flash memory dual inline memory module (DIMM) comprising:
a printed circuit board with an edge connector;
a first plurality of multi-chip packaged flash memory/support application specific integrated circuit (ASIC) parts mounted to the printed circuit board and electrically coupled to the edge connector, each of the first plurality of multi-chip packaged flash memory/support ASIC parts including
one or more randomly accessible flash memory die to periodically store data in a non-volatile manner, wherein the one or more randomly accessible flash memory die operate with a power supply voltage level differing from a power supply voltage level to be provided at the edge connector, and
an application specific integrated circuit die including one or more circuits to convert one or more voltages to that used to operate the one or more randomly accessible flash memory die to avoid mounting power conversion circuitry to the printed circuit board and increasing the height of the printed circuit board.

21. The flash memory DIMM of claim 20, wherein
the power supply voltage level to be provided at the edge connector is one of substantially 2.5 volts in accordance with Joint Electron Device Engineering Councils (JEDEC) double data rate (DDR) memory standards, substantially 1.8 volts in accordance with JEDEC double data rate two (DDR2) memory standards, or substantially 1.5 volts in accordance with JEDEC double data rate three (DDR3) memory standards for dual inline memory modules.

22. A flash memory dual inline memory module (DIMM) comprising:
printed circuit board with an edge connector,
a first plurality of multi-chip packaged flash memory/support application specific integrated circuit (ASIC) parts mounted in a parallel row to a front side of the printed circuit board and electrically coupled to the edge connector, each of the first plurality of multi-chip packaged flash memory/support ASIC parts including one or more randomly memory die to periodically store data in a non-volatile manner;
a second plurality of multi-chip packaged flash memory/support ASIC parts mounted in a parallel row to a back side of the printed circuit board and electrically coupled to the edge connector, each of the second plurality of multi-chip packaged flash memory/support ASIC parts including one or more randomly accessible flash memory die to periodically store data in a non-volatile manner;
wherein the first plurality of multi-chip packaged flash memory/support ASIC parts include a front/back control signal input set to a front mode setting indicating to circuits therein that they are mounted to the front side of the printed circuit board; and
wherein the second plurality of multi-chip packaged flash memory/support ASIC parts include a front/back control signal input set to a back mode setting indicating to circuits therein that they are mounted to the back side of the printed circuit board.

23. The flash memory DIMM of claim 22, wherein
the front mode setting is a positive power supply voltage (VDD) and the first front/back control signal input of the first plurality of multi-chip packaged flash memory/support ASIC parts is coupled to VDD, and
the back mode setting is a ground voltage (VSS) and the second front/back control signal input of the second plurality of multi-chip packaged flash memory/support ASIC parts is coupled to VSS.

24. The flash memory DIMM of claim 22, wherein
the front mode setting is a ground voltage (VSS) and the first front/back control signal input of the first plurality of multi-chip packaged flash memory/support ASIC parts is coupled to VSS, and
the back mode setting is a positive power supply voltage (VDD) and the second front/back control signal input of the second plurality of multi-chip packaged flash memory/support ASIC parts is coupled to VDD.

25. The flash memory DIMM of claim 22, further comprising:
a first address device mounted to the front side of the printed circuit board and electrically coupled to the edge connector and the first plurality of multi-chip packaged flash memory/support ASIC parts; and
a second address device mounted to the back side of the printed circuit board and electrically coupled to the edge connector and the second plurality of multi-chip packaged flash memory/support ASIC parts.

26. A flash memory dual inline memory module (DIMM) comprising:
a printed circuit board with an edge connector;
a first plurality of multi-chip packaged flash memory/support application specific integrated circuit (ASIC) parts mounted to the printed circuit board and electrically coupled to the edge connector, each of the first plurality of multi-chip packaged flash memory/support ASIC parts including an application specific integrated circuit (ASIC) die mounted to a substrate and one or more randomly accessible flash memory die mounted to the substrate and electrically coupled to the ASIC die, the one or more randomly accessible flash memory die to periodically store data in a non-volatile manner,
wherein the one or more randomly accessible flash memory die operate with a power supply voltage level differing from a power supply voltage level to be provided at the edge connector and the ASIC die includes one or more circuits to translate signal voltages for signals communicated between the edge connector and the randomly accessible flash memory die.

27. The flash memory DIMM of claim 26, wherein
the power supply voltage level to be provided at the edge connector is one of 2.5 volts, 1.8 volts, and 1.5 volts.

28. The flash memory DIMM of claim 26, further comprising:
a first address device mounted to the printed circuit board and electrically coupled to the edge connector and the first plurality of multi-chip packaged flash memory/support ASIC parts.

* * * * *